(12) United States Patent
Li

(10) Patent No.: US 11,929,338 B2
(45) Date of Patent: Mar. 12, 2024

(54) HONEYCOMB PATTERN FOR CONDUCTIVE FEATURES

(71) Applicant: Taiwan Semiconductor Manufacturing Co., Ltd., Hsinchu (TW)

(72) Inventor: Shenggao Li, Cupertino, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/300,862

(22) Filed: Apr. 14, 2023

(65) Prior Publication Data

US 2023/0253357 A1    Aug. 10, 2023

Related U.S. Application Data

(63) Continuation of application No. 17/363,968, filed on Jun. 30, 2021, now Pat. No. 11,652,075.

(Continued)

(51) Int. Cl.
| | |
|---|---|
| *H01L 23/00* | (2006.01) |
| *H01L 23/48* | (2006.01) |
| *H01L 23/498* | (2006.01) |
| *H01L 23/538* | (2006.01) |
| *H01L 25/00* | (2006.01) |
| *H01L 25/065* | (2023.01) |

(52) U.S. Cl.
CPC ............ *H01L 24/17* (2013.01); *H01L 23/481* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 24/73* (2013.01); *H01L 25/0652* (2013.01); *H01L 25/50* (2013.01); *H01L 2224/16146* (2013.01); *H01L 2224/16235* (2013.01); *H01L 2224/17142* (2013.01); *H01L 2224/17152* (2013.01); *H01L 2224/73204* (2013.01); *H01L 2225/06513* (2013.01); *H01L 2225/06517* (2013.01); *H01L 2225/0652* (2013.01); *H01L 2225/06541* (2013.01); *H01L 2225/06548* (2013.01); *H01L 2225/06568* (2013.01); *H01L 2924/1431* (2013.01); *H01L 2924/1434* (2013.01)

(58) Field of Classification Search
CPC ............................. H01L 24/17; H01L 23/481
See application file for complete search history.

(56) References Cited

U.S. PATENT DOCUMENTS

| | | |
|---|---|---|
| 10,748,841 B2 | 8/2020 | Chen et al. |
| 2018/0286798 A1 | 10/2018 | Waidhas et al. |

OTHER PUBLICATIONS

Hales, Thomas C., "The Honeycomb Conjecture," May 20, 2002, 24 pages.

(Continued)

*Primary Examiner* — Errol V Fernandes
(74) *Attorney, Agent, or Firm* — Slater Matsil, LLP

(57) ABSTRACT

A method includes forming a first package component, and forming a first plurality of electrical connectors at a first surface of the first package component. The first plurality of electrical connectors are laid out as having a honeycomb pattern. A second package component is bonded to the first package component, wherein a second plurality of electrical connectors at a second surface of the second package component are bonded to the first plurality of electrical connectors.

20 Claims, 20 Drawing Sheets

Related U.S. Application Data

(60) Provisional application No. 63/188,156, filed on May 13, 2021.

(56) References Cited

OTHER PUBLICATIONS

Park, et al., "20nm Dram: A new beginning of another revolution," 2015 IEEE International Electron Devices Meeting (IEDM), Dec. 7-9, 2015, 4 pages.

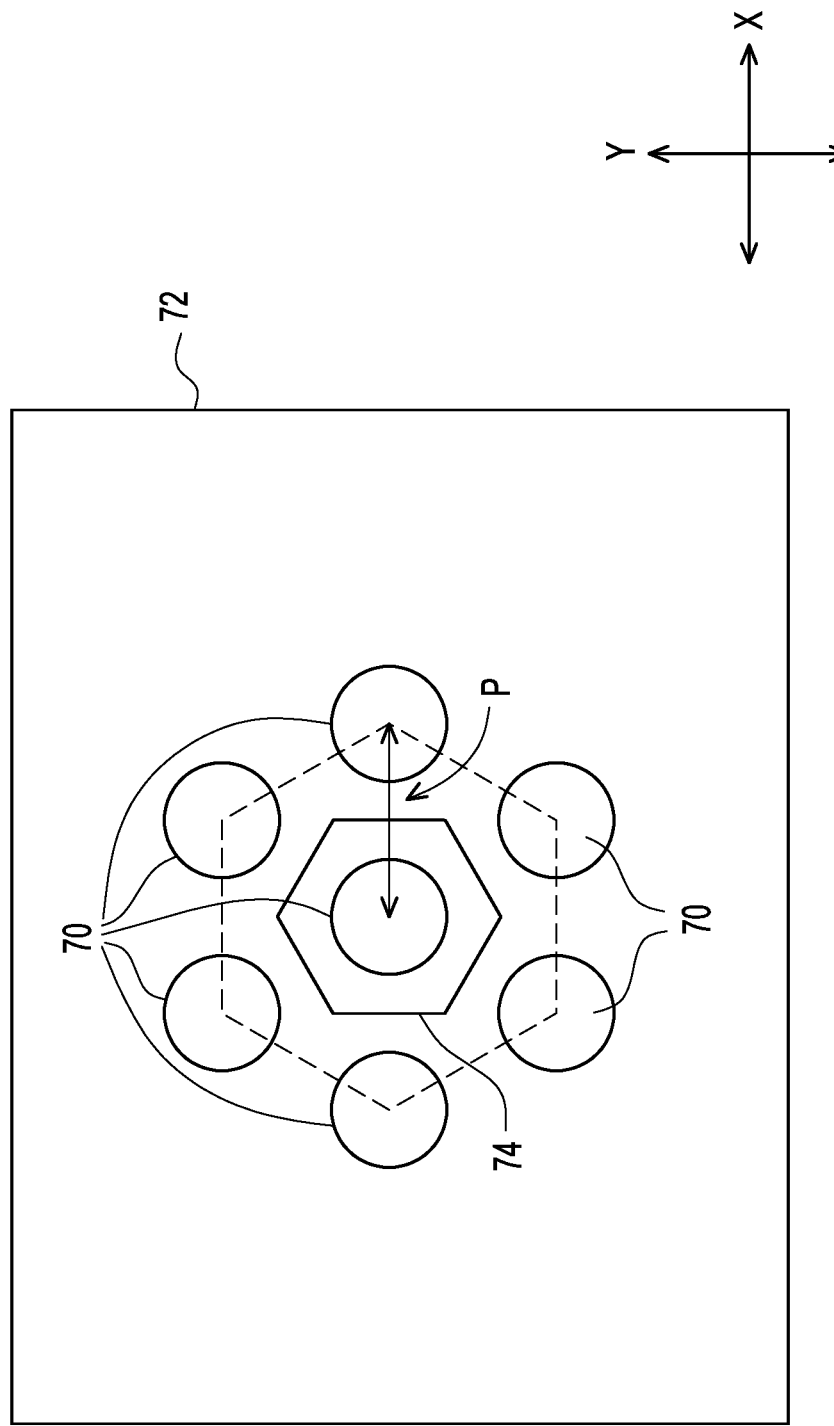

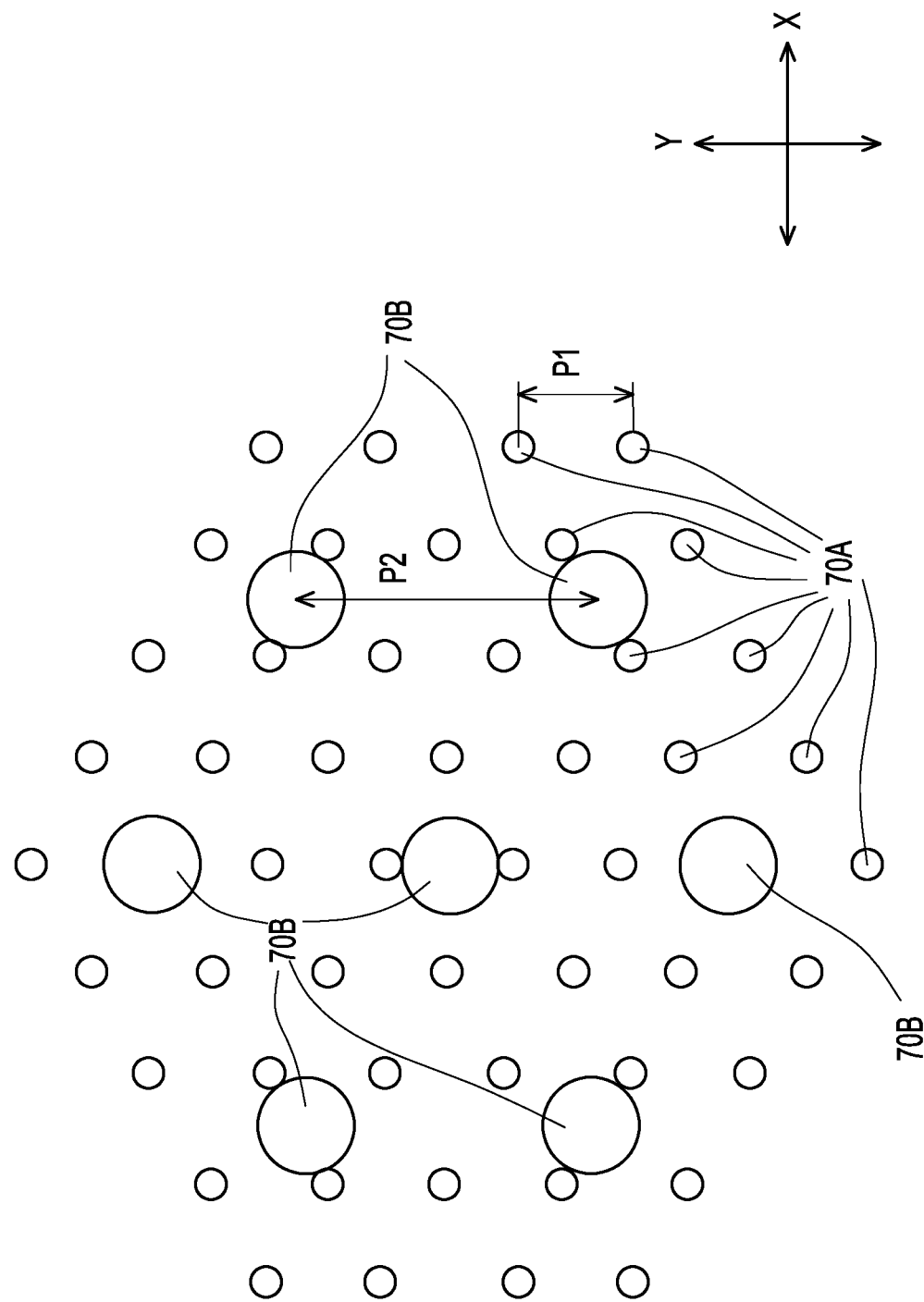

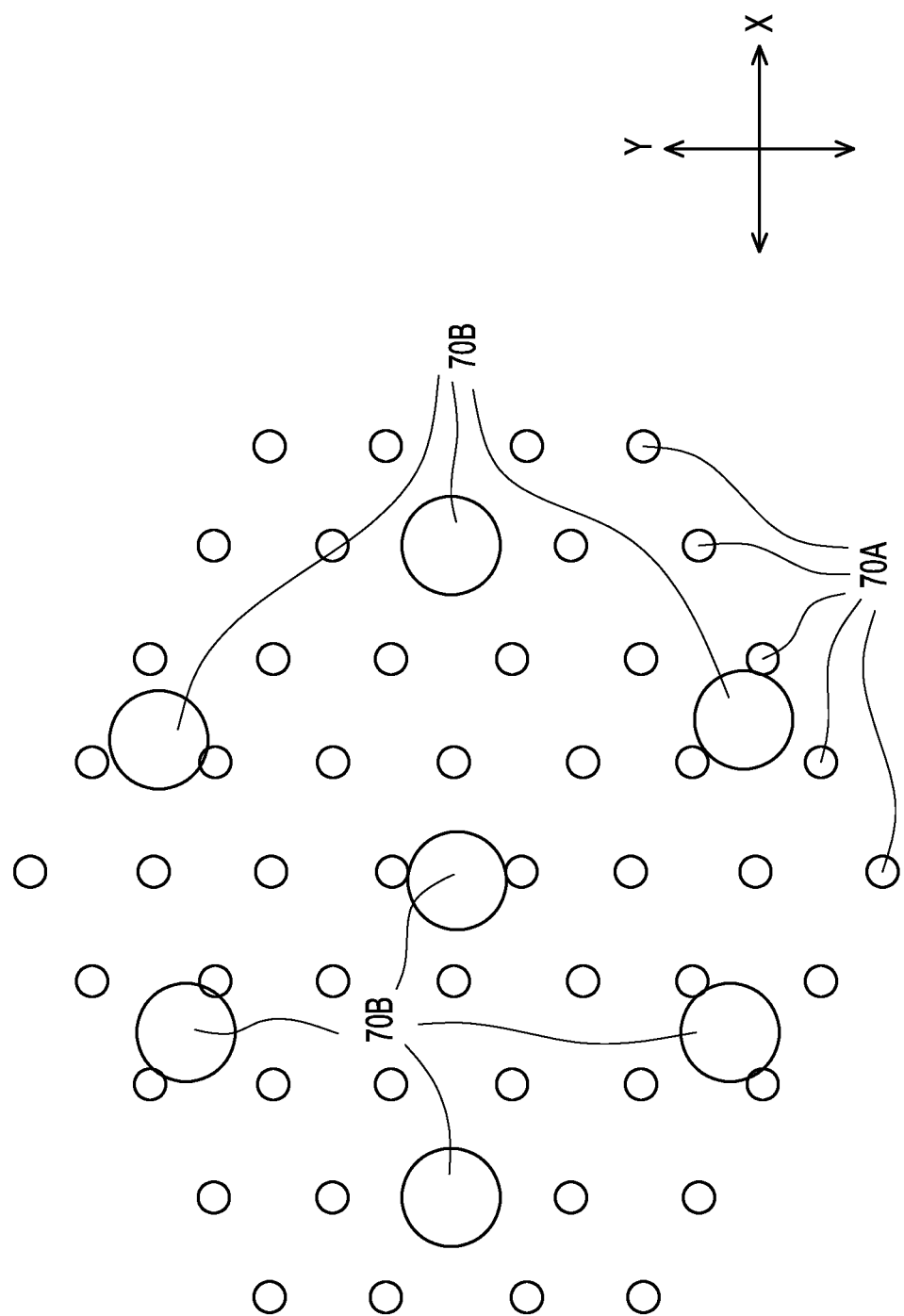

HONEYCOMB PATTERN FOR CONDUCTIVE FEATURES

PRIORITY CLAIM AND CROSS-REFERENCE

This application is a continuation of U.S. patent application Ser. No. 17/363,968, entitled "Honeycomb Pattern for Conductive Features," and filed Jun. 30, 2021, which claims the benefit of the following provisionally filed U.S. Patent application: Application No. 63/188,156, filed on May 13, 2021, and entitled "Honeycomb Bump/uBump/TSV Pattern for Increased Data Transfer Density in 3DIC," which applications are hereby incorporated herein by reference.

BACKGROUND

Integrated circuit packages may have a plurality of package components such as device dies and package substrates bonded together to increase the functionality and integration level. The device dies and the packages are made increasingly larger to accommodate more functions. Increasingly higher bandwidth is also demanded for the signal communication between the device dies and packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9 and 10 illustrate a vertical honeycomb pattern and a horizontal honeycomb pattern in accordance with some embodiments.

FIGS. 13 and 14 illustrate the top views of two layers of conductive features arranged in honeycomb patterns in accordance with some embodiments.

DETAILED DESCRIPTION

Figure 1:
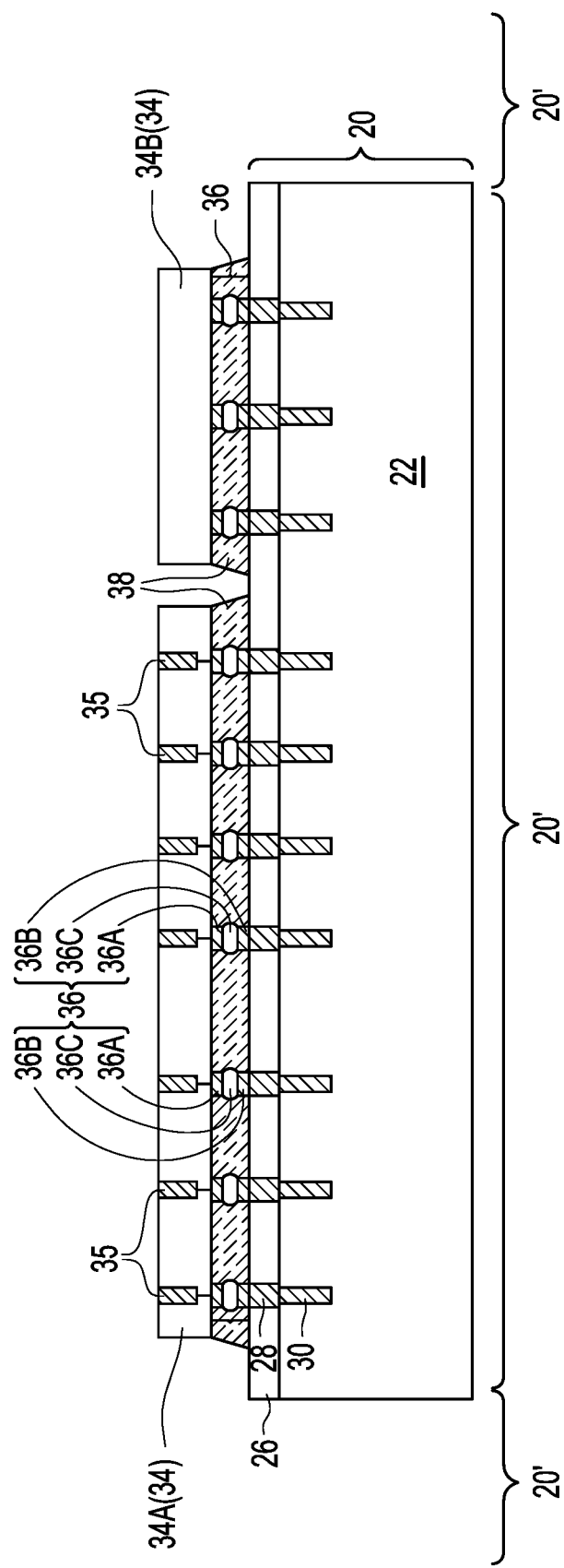
FIGS. 1-6 illustrate the cross-sectional views of intermediate stages in the formation of a package including conductive features arranged as a honeycomb pattern in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments of the present disclosure, conductive features such as bond pads, bumps, through-vias, and the like are arranged as having honeycomb patterns. This results in the increase in the number of conductive patterns per unit area. Also, when the honeycomb patterns are used for the electrical communication between package components, the bandwidth of the signal communication is also increased due to the increase in the number of parallel communication paths. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 6 illustrate the cross-sectional views of intermediate stages in the formation of a package including conductive features arranged as a honeycomb pattern in accordance with some embodiments. The corresponding processes are also reflected schematically in the process flow shown in FIG. 21.

Referring to FIG. 1, package component 20 is provided, which includes package components 20' therein. Package component 20 may be an interposer wafer free from active devices therein in accordance with some embodiments. In subsequent discussion, package component 20 may be alternatively referred to as an interposer wafer, and package components 20' are accordingly alternatively referred to as interposers as an example. Package component 20 may also be of other types such as a device wafer (including active devices therein), a reconstructed wafer (including device dies packaged therein), a package substrate strip, or the like. Correspondingly, package components 20' may also be device dies, packages, package substrates, or the like.

In accordance with some embodiments, package component 20 includes substrate 22, and an interconnect structure 24 over substrate 22. The interconnected structure 24 may include a plurality of dielectric layers and conductive features (such as metal lines, vias, and bond pads) therein. The dielectric layers and the conductive features are represented using reference numerals 26 and 28, respectively. In accordance with some embodiments, substrate 22 is a semiconductor substrate, which may be a silicon substrate. In accordance with alternative embodiments, substrate 22 is a dielectric substrate.

Through-vias 30 may be formed to extend into semiconductor substrate 22, and are electrically connected to conductive features 28. In accordance with some embodiments, through-vias 30 are laid out as having a honeycomb pattern, as illustrated and discussed in detail referring to FIGS. 9, 10, 13, and 14. Such layout may increase the density of through-vias 30 (the number of through-vias per unit area) without requiring the pitches of through-vias 30 to be increased.

Figure 21:
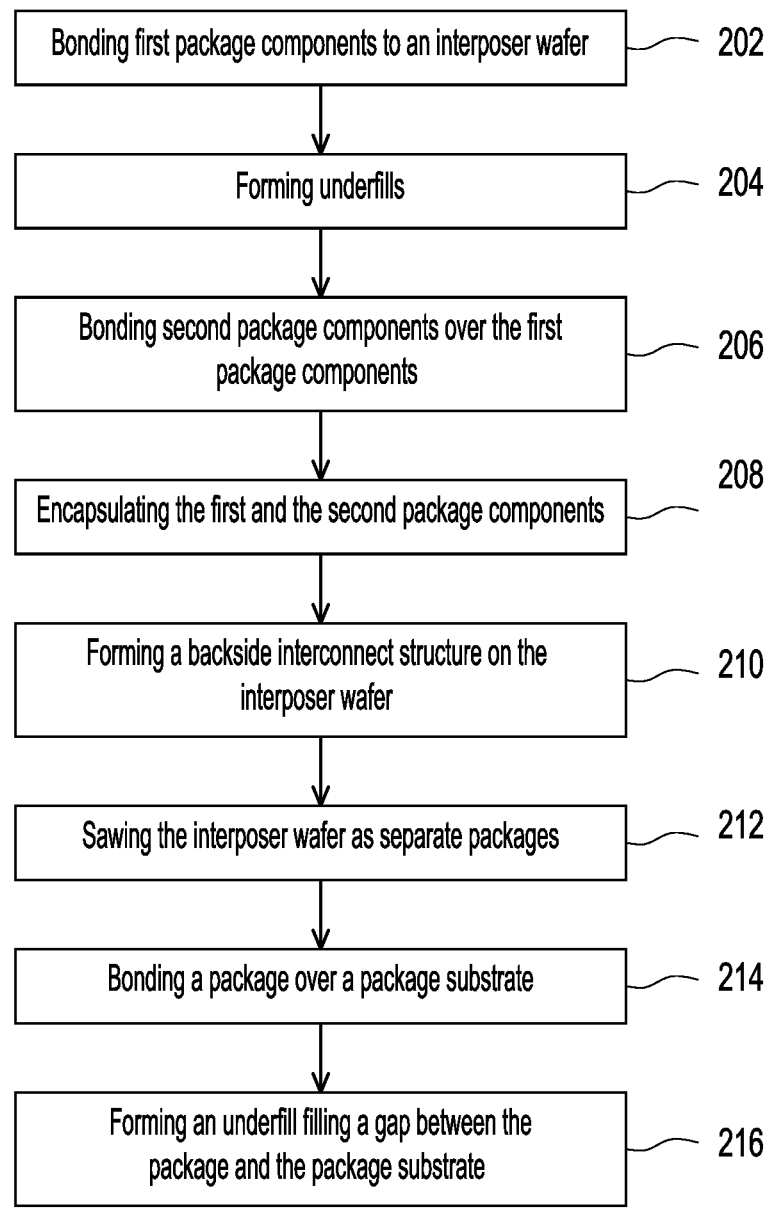
FIG. 21 illustrates a process flow for forming a package in accordance with some embodiments.

Package components 34 are attached and bonded to package component 20. The respective process is illustrated as process 202 in the process flow 200 as shown in FIG. 21. Although one group of package components 34 is illustrated, there may also be a plurality of identical groups of package components 34 attached, with each group being attached to a corresponding interposer 20'. Each of the package components 34 may be selected from or may comprise a logic die, a memory die, a package, an Independent Passive Device (IPD), or the like. For example, the logic device dies in package components 34 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 34 may include Static Random Access Memory (SRAM) dies, Dynamic Random Access Memory (DRAM) dies, or the like. The device dies in package components 34 may include semiconductor substrates and interconnect structures. Some of the package components 34 may be SoC dies in accordance with some embodiments, while some other package components 34 may be memory stacks such as High-Performance Memory (HBM) stacks.

In accordance with some embodiments, one of package components 34 (such as the package component 34A on the left side of FIG. 1) is a cache memory die. Another package component 34 (such as the package component 34B on the right side of FIG. 1) may be an input-output (IO) die. The bonding of package components 34 to the underlying interposers 20' may be through electrical connectors 36. Electrical connectors 36 may include conductive bumps such as metal bumps, bond pads, metal pillars, or the like. In accordance with some embodiments, some of package components 34 (such as 34A) may include a semiconductor substrate, and through-vias 35 penetrating through the semiconductor substrate.

In accordance with some embodiments, electrical connectors 36 include electrical connectors 36A, 36B, and 36C. Electrical connectors 36A are parts of interposer wafer 20. Electrical connectors 36B are parts of package components 34, and are bonded to electrical connectors 36A. Electrical connectors 36A and 36B may be metal pads, metal pillars, or the like. Electrical connectors 36A and 36B may also be referred to as micro-bumps (ubumps). In accordance with some embodiments, package components 34 are bonded to interposer wafer 20 through solder bonding. Accordingly, solder regions 36C are between electrical connectors 36A and 36B. In accordance with alternative embodiments, package components 34 are bonded to interposer wafer 20 through metal-to-metal direct bonding, and hence electrical connectors 36A physically join the corresponding electrical connectors 36B, for example, through metal inter-diffusion. In accordance with yet alternative embodiments, package components 34 are bonded to interposer wafer 20 through hybrid bonding. The hybrid bonds include bond pads 36A and 36B bonded to each other through metal-to-metal direct bonding, and dielectric layers of package components 34 and 20 bonded to each other through fusion bonding.

In accordance with some embodiments, either electrical connectors 36 or through-vias 35, or both, are laid out as having a honeycomb pattern, as illustrated and discussed in detail referring to FIGS. 9, 10, 13, and 14. Through-vias 30 may also be laid out as having a honeycomb pattern. Adopting honeycomb patterns may increase the density of the signal interconnection wires, and may increase the bandwidth of the signal communication.

In accordance with some embodiments, underfills 38 are dispensed into the gaps between package components 34 and the underlying package components 20', and are cured as solid. The respective process is illustrated as process 204 in the process flow 200 as shown in FIG. 21. In accordance with alternative embodiments, no underfill is dispensed at this time.

Figure 2:
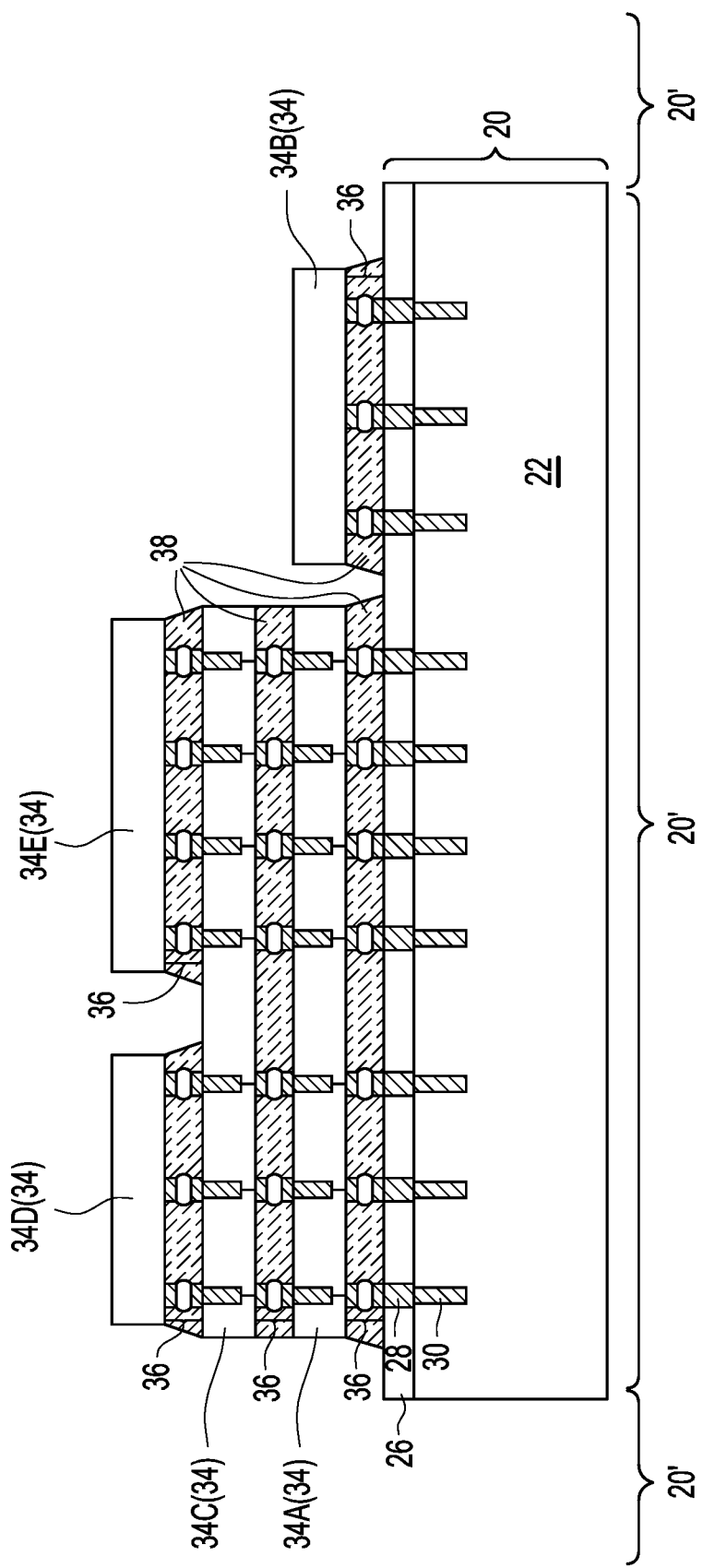

FIG. 2 illustrates the bonding of additional package components 34 (such as package components 34C, 34D, and 34E) on the structure shown in FIG. 1. The respective process is illustrated as process 206 in the process flow 200 as shown in FIG. 21. Each of the package components may be selected from device dies, packages, IPDs, or the like. In accordance with some embodiments, package component 34C comprises a cache memory die, package component 34D comprises a CPU die, and package component 34E comprises an accelerator (ACC) die. Each of package components 34C, 34D, and 34E may be bonded to the underlying package components through electrical connectors 36, which may include metal bumps, metal pads, metal pillars, or the like, and may or may not include solder regions. Package component 34C may also include a semiconductor substrate, and through-vias 35 penetrating through the semiconductor substrate. Underfills 38 may be (or may not be) dispensed and cured.

In accordance with some embodiments, the electrical connectors 36 of package components 34A, 34C, 34D, and 34E may be laid out as having honeycomb patterns, as illustrated and discussed in detail referring to FIGS. 9, 10, 13, and 14. Through-vias 35 may also be laid out as having honeycomb patterns.

Figure 3:
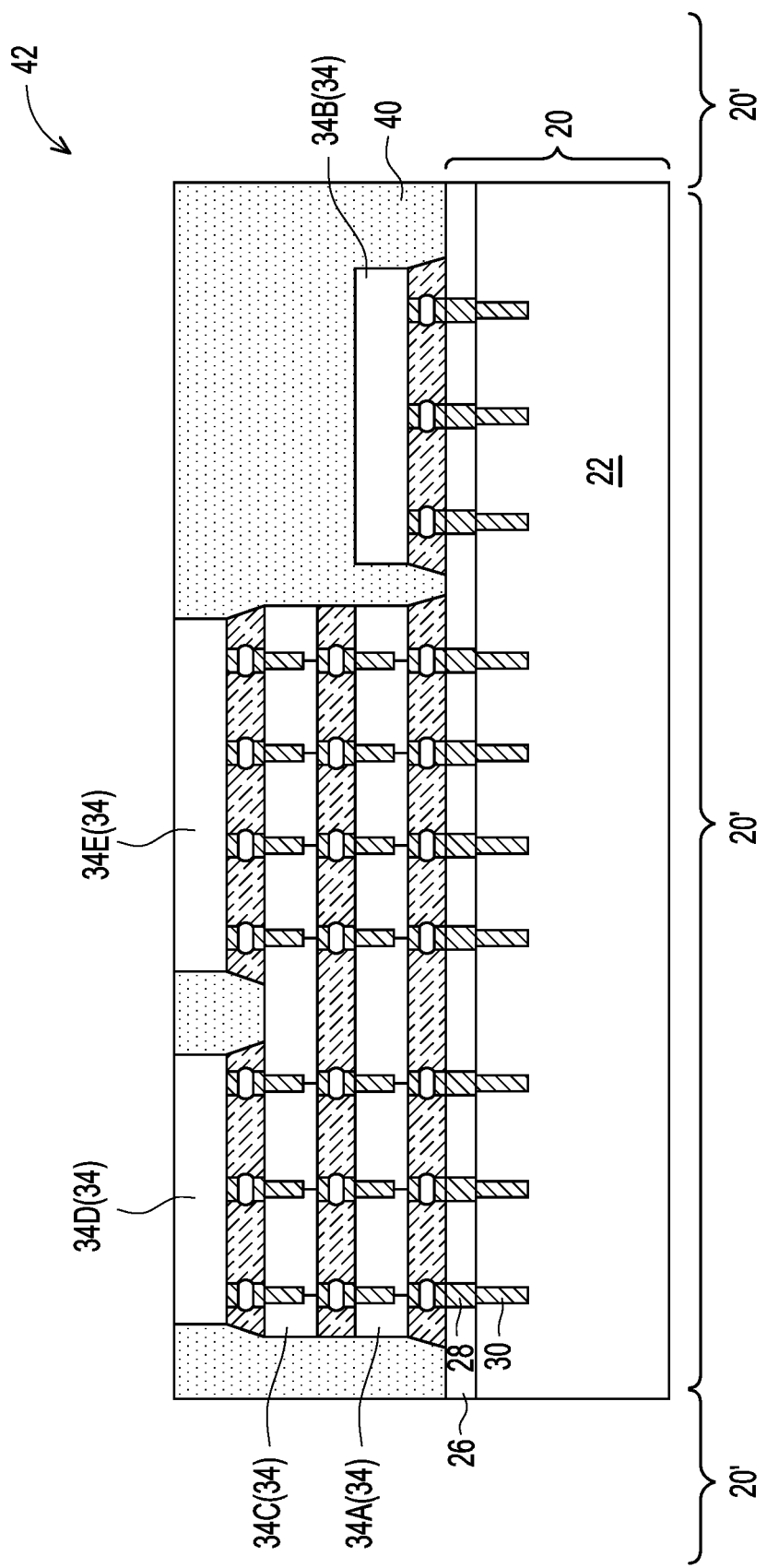

FIG. 3 illustrates the encapsulation of the package components 34 in encapsulant 40, which may comprise a molding compound, a molding underfill, or the like. The respective process is illustrated as process 208 in the process flow 200 as shown in FIG. 21. Encapsulant 40 may include a base material and a filler (such as filler particles) mixed in the base material. After the encapsulant 40 is dispensed, a curing process is performed to solidify encapsulant 40. A planarization process such as a Chemical Mechanical Polish (CMP) process or a mechanical polishing process is performed to remove excess encapsulant 40. The substrates (such as semiconductor substrates) of some package components 34 may thus be exposed. The resulting structure is referred to as reconstructed wafer 42.

Figure 4:
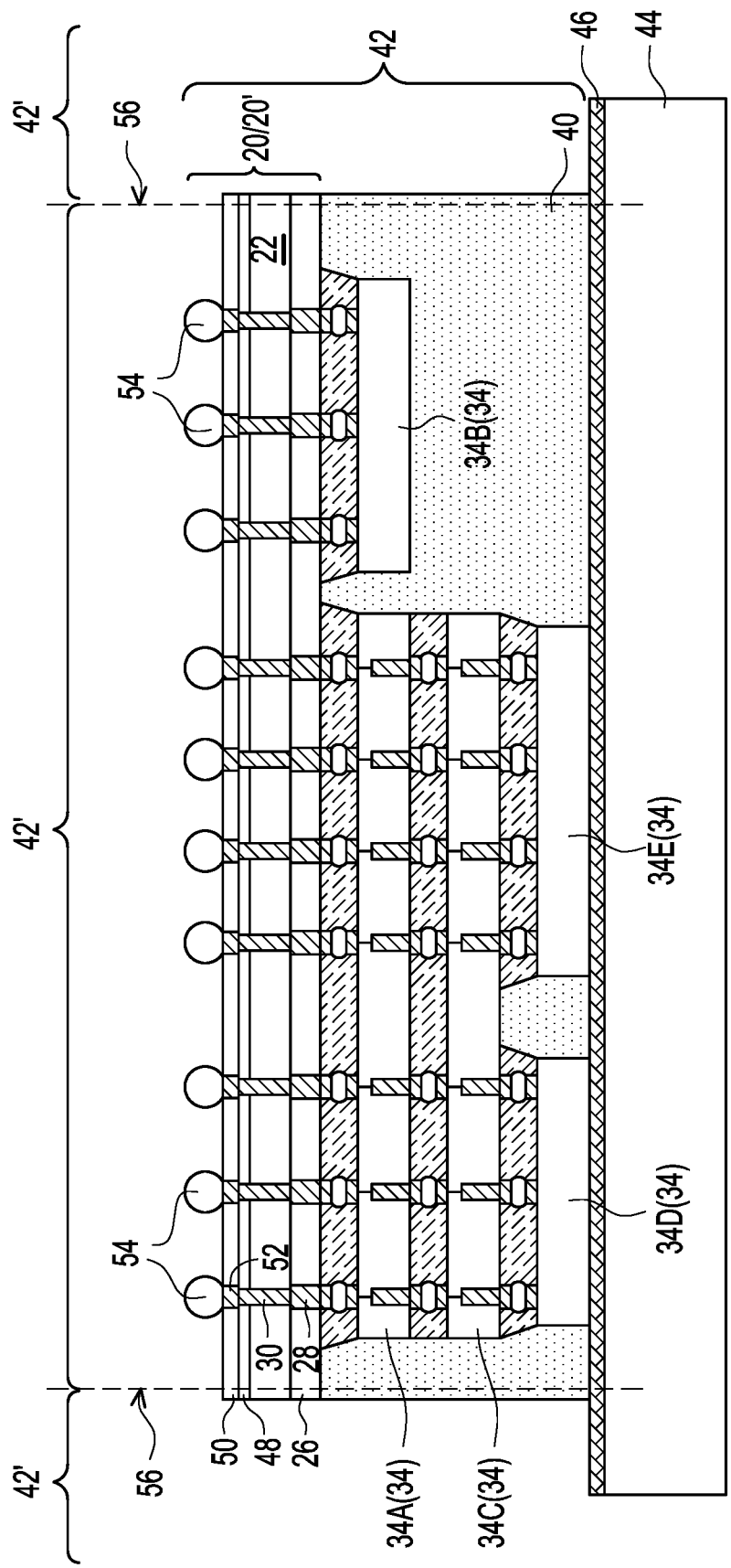

Referring to FIG. 4, reconstructed wafer 42 is flipped upside down, and is placed over carrier 44. Carrier 44 may be a glass carrier, an organic carrier, or the like. Release film 46 is formed on carrier 44 for attaching reconstructed wafer 42 to carrier 44. In accordance with some embodiments of the present disclosure, release film 46 comprises an epoxybased thermal-release material, which is coated onto carrier 44. The thermal-release material in release film 46 may be capable of being decomposed under the heat of a light beam (such as a laser beam), so that reconstructed wafer 42 may be detached from carrier 44 in subsequently processes.

FIG. 4 also illustrates the formation of a backside interconnect structure on the backside of interposer wafer 20. The respective process is illustrated as process 210 in the process flow 200 as shown in FIG. 21. In accordance with some embodiments, a backside grinding is performed to thin substrate 22, until through-vias 30 are exposed. Next, substrate 22 may be recessed slightly through etching, so that through-vias 30 protrude out of the back surface of substrate 22. The portions of the space between the protruding end portions of through-vias 30 are referred to as recesses. A dielectric material such as silicon oxide, silicon nitride, silicon oxynitride, silicon oxycarbide, or the like is then deposited into the recess, followed by a planarization process to level the top surface of the dielectric material and through-vias 30. The remaining dielectric material is shown as dielectric layer 48. The end portions of through-vias 30 are thus inside dielectric layer 48.

Next, dielectric layer(s) 50 and conductive features 52 (including RDLs and/or metal pads) are formed to electrically connect to through-vias 30. In accordance with some embodiments of the present disclosure, dielectric layers 50 are formed of inorganic dielectric materials including oxides (such as silicon oxide, doped silicate glasses), nitrides (such as silicon nitride), or the like. In accordance with alternative embodiments, dielectric layers 50 are formed of organic materials such as polymers, which may include polyimide, polybenzoxazole (PBO), or the like. Conductive features 52 may be formed through plating, or alternatively, through damascene processes. The material of Conductive features 52 may include copper, aluminum, nickel, tungsten, titanium, or the like, or combinations thereof. Electrical connectors 54, which may include bond pads, metal pillars, solder regions, and/or the like, are formed. Electrical connectors 54 may also be arranged as a honeycomb pattern so that the density of electrical connectors 54 is increased without reducing the pitch of electrical connectors 54.

Next, in accordance with some embodiments, reconstructed wafer 42 may be de-bonded from carrier 44. In accordance with some embodiments, a light beam such as a laser beam is projected on release film 46, and release film 46 is decomposed under the heat of the light beam. Reconstructed wafer 42 is thus released from carrier 44. In a subsequent process, reconstructed wafer 42 may be placed on a dicing tape (not shown), and is singulated through a sawing process along scribe lines 56, so that reconstructed wafer 42 is separated into a plurality of discrete and identical packages 42'. The respective process is illustrated as process 212 in the process flow 200 as shown in FIG. 21.

Figure 5:
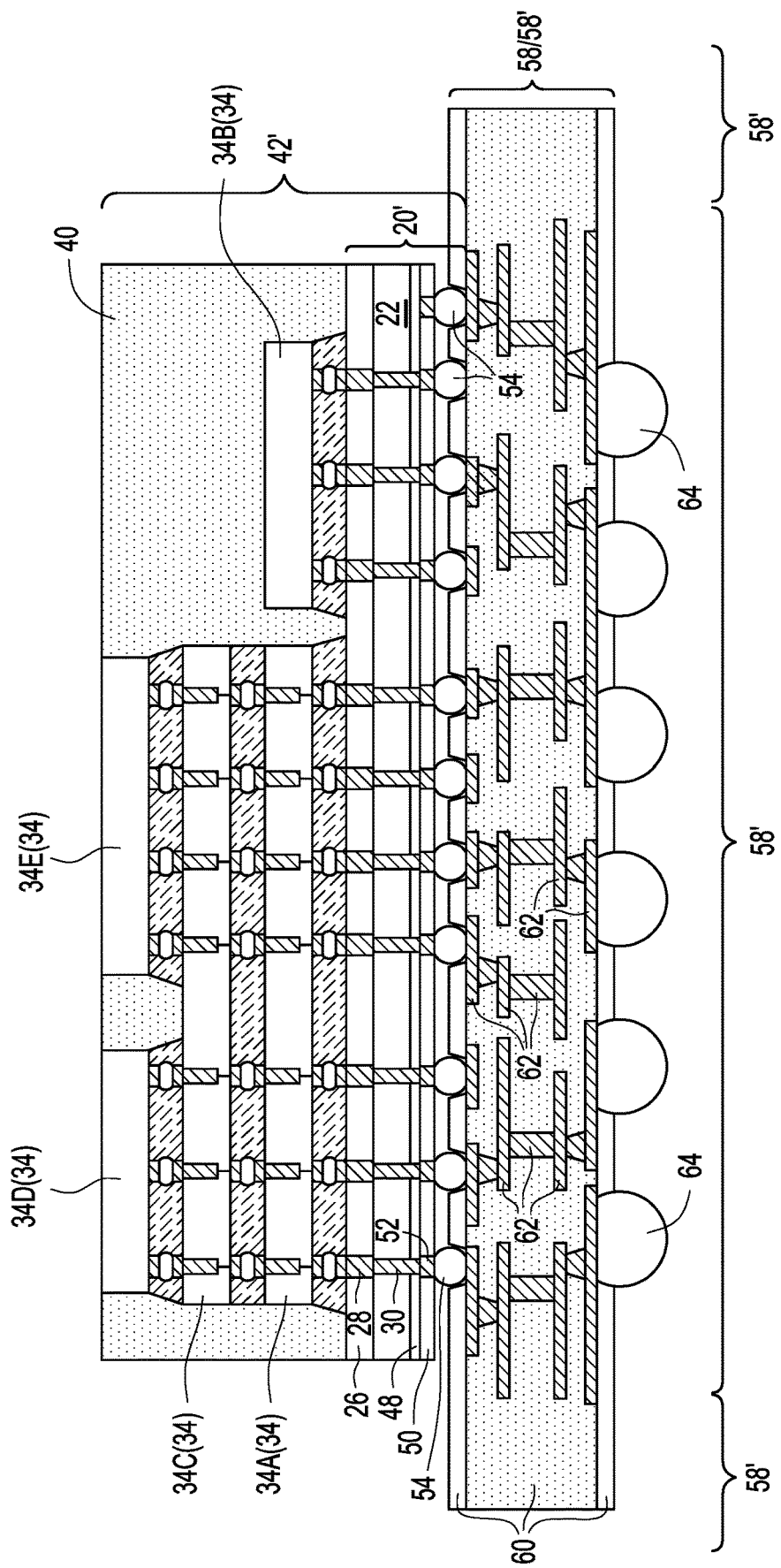

FIG. 5 illustrates the bonding of package 42' onto another package component 58. The respective process is illustrated as process 214 in the process flow 200 as shown in FIG. 21. In accordance with some embodiments, package component 58 is a wafer-level component, which includes a plurality of identical package components 58' therein. For example, package component 58 may be a package substrate strip, which includes a plurality of package substrates 58' therein. Package substrates 58' may be cored package substrates including cores, or may be core-less package substrates that do not have cores therein. In accordance with alternative embodiments, package components 58' may be of other types such as interposers, printed circuit boards, or the like. Package components 58' may be free from active devices such as transistors and diodes therein. Package component 58 may also be free from (or may include) passive devices such as capacitors, inductors, resistors, or the like therein. Package component 58 may also be a reconstructed wafer including packaged device dies therein.

Package component 58 includes a plurality of dielectric layers 60. In accordance with some embodiments, dielectric layers 60 may comprise dry films such as Ajinomoto Build-up Films (ABFs), polybenzoxazole (PBO), polyimide, or the like. When dielectric layers 60 comprise cores, the dielectric materials may include epoxy, resin, glass fiber, prepreg, glass, molding compound, plastic, combinations thereof, and/or multi-layers thereof. Redistribution lines 62, which include metal lines/pads and vias, are formed in dielectric layers 60. Redistribution lines 62 are interconnected to form through-connections in package component 58. Package component 58 may also include solder regions 64 at its bottom. In accordance with some embodiments, solder regions 64 may be laid out as having a honeycomb pattern, as illustrated and discussed in detail referring to FIGS. 9, 10, 13, and 14.

Figure 6:
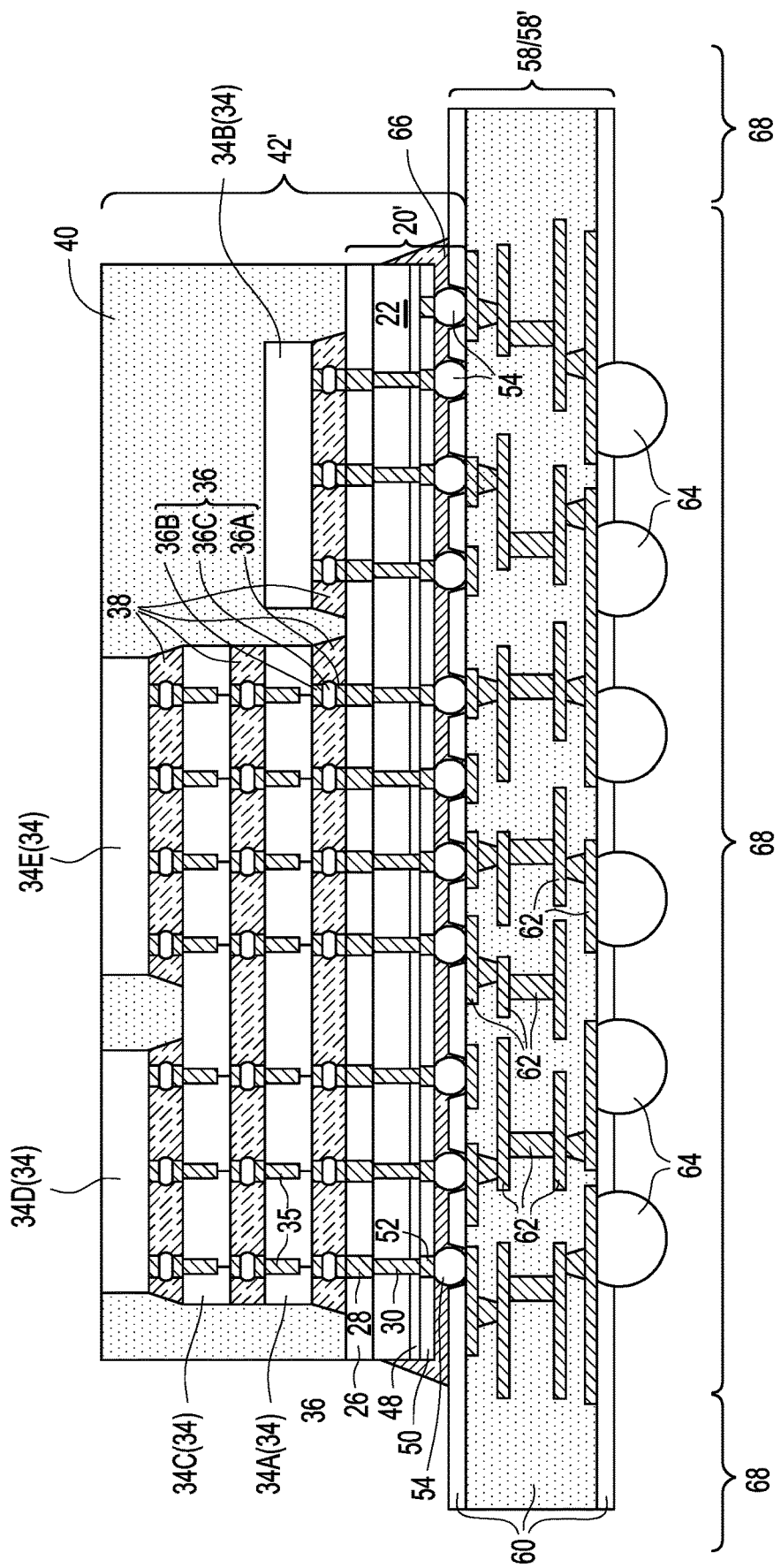

FIG. 6 illustrates the dispensing of underfill 66. The respective process is illustrated as process 216 in the process flow 200 as shown in FIG. 21. Underfill 66 is then cured. A singulation process may be performed to saw package component 58 apart, so that a plurality of packages 68 are formed, each including a package 42' and a package component 58'.

Figure 7:
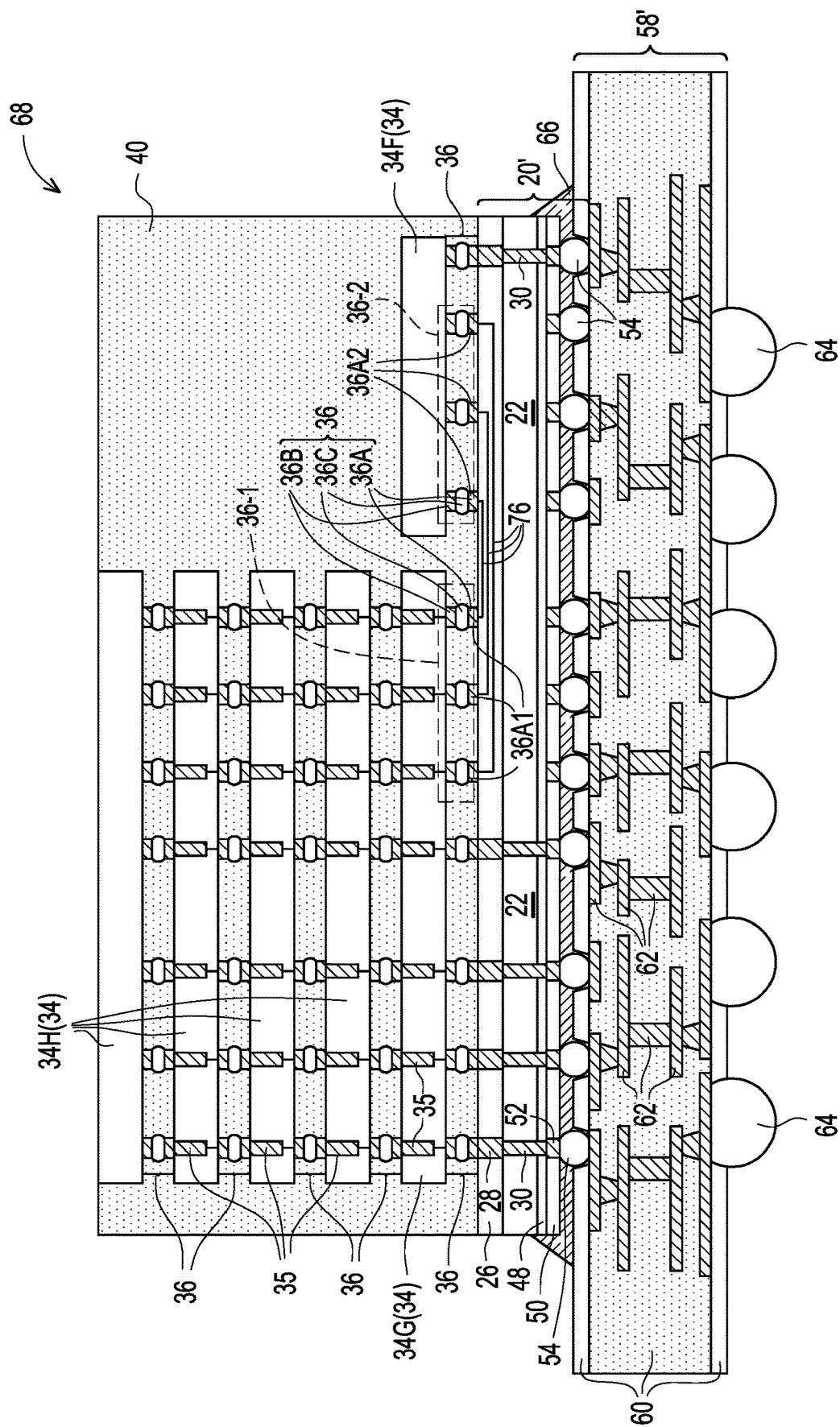
FIGS. 7 and 8 illustrate the packages including conductive features arranged with a honeycomb pattern in accordance with some embodiments.

FIG. 7 illustrates package 68 formed according to alternative embodiments. Package 68 may include package component 58' (such as a package substrate), package component 20' (such as an interposer), and package components 34F, 34G, and 34H bonded to package component 20'. In accordance with some embodiments, package component 34F is a processor die, which may be a GPU die, a CPU die, a SoC, or the like. Package component 34G may be another type of logic die, which may be a controller of memory dies. Package components 34H may be memory dies in accordance with some embodiments.

In accordance with some embodiments, package components 34F and 34G are electrically and signally interconnected through conductive lines 76, which are parts of interposer 20'. The horizontal portions of conductive lines 76 may be located in one of the metal layers (or RDL layers) in interposer 20', or may extend into multiple metal layers.

In accordance with some embodiments, package component 20' may include through-vias 30 penetrating through the substrate 22 in package component 20'. Package components 34G and 34H may include semiconductor substrates and through-vias 35 penetrating through the corresponding semiconductor substrates. Each of the upper package components 34H may be bonded to the underlying package components through electrical connectors 36. In accordance with some embodiments, electrical connectors 36, through-vias 30 and 35, electrical connectors 54, solder regions 64, and the like may be arranged as having honeycomb patterns.

Figure 8:
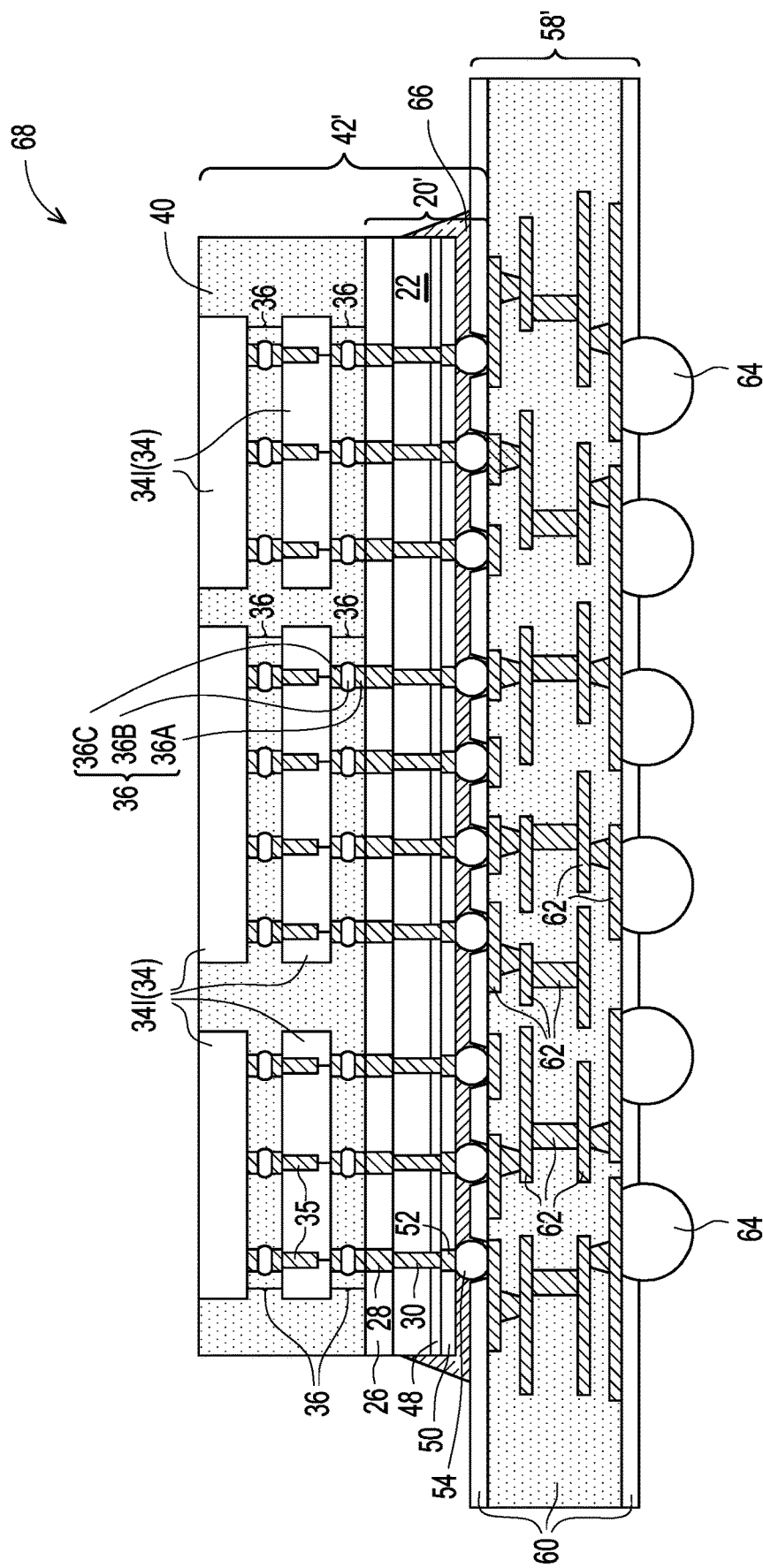

FIG. 8 illustrates package 68 formed according to alternative embodiments. Package 68 may include package component 58' (such as a package substrate), package component 20' (such as an interposer), and package components 34I bonded over package component 20' in accordance with some embodiments. In accordance with some embodiments, package components 34I are stacked to form a plurality of die stacks, which may include memory stacks. Alternatively, each of the die stacks may include a logic die and a memory die(s) over the logic die.

In accordance with some embodiments, package component 20' may include through-vias 30 penetrating through the substrate in package component 20'. Package components 34I may include semiconductor substrates and through-vias 35 penetrating through the corresponding semiconductor substrates. Each of the upper package components 34I may be bonded to the underlying package components 34I through electrical connectors 36. In accordance with some embodiments, electrical connectors 36, through-vias 30 and 35, electrical connectors 54, solder regions 64, and the like may be arranged as having honeycomb patterns.

Figure 9:
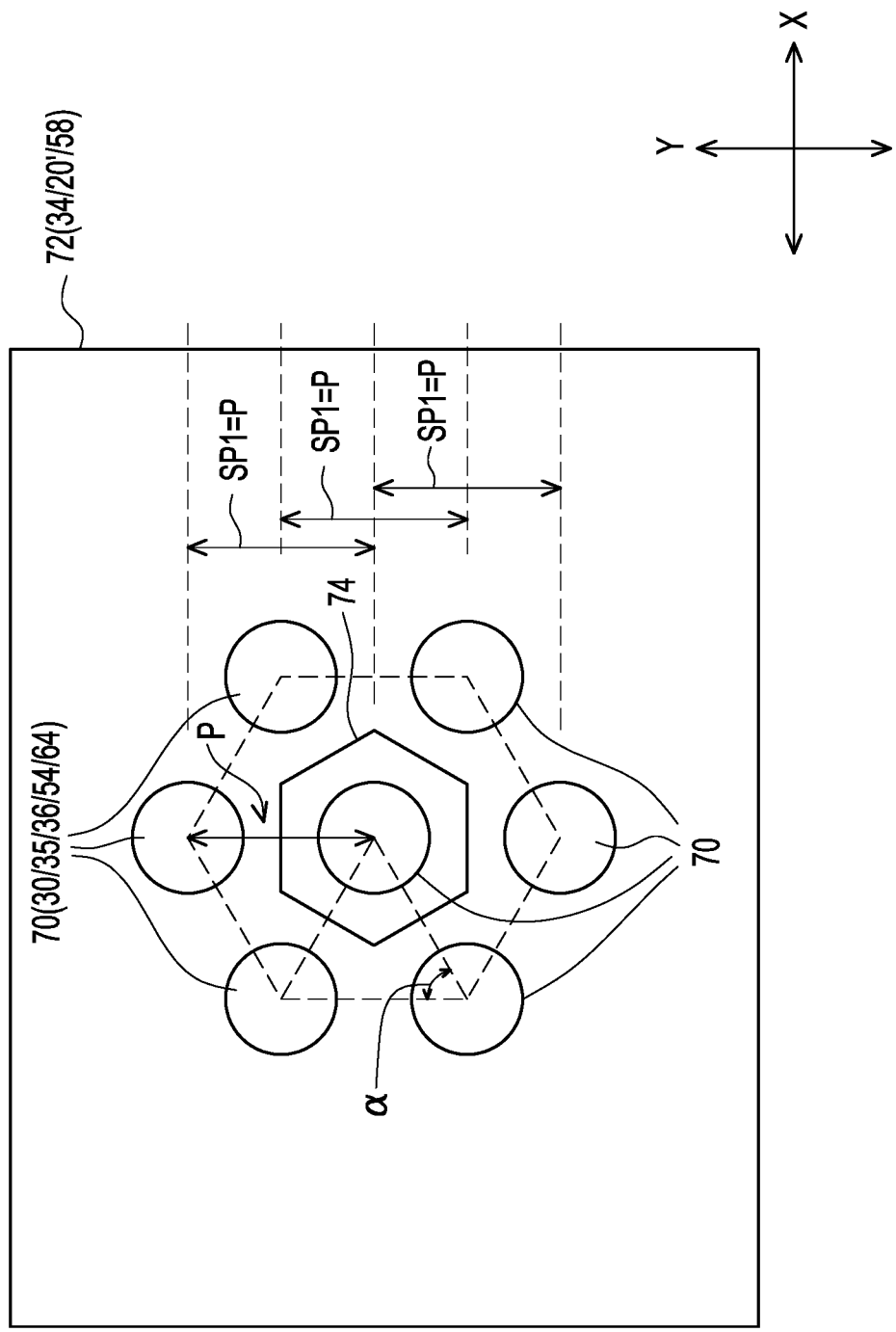

In accordance with some embodiments of the present disclosure, a plurality of conductive features in packages are formed as having a honeycomb pattern. The conductive features includes, and are not limited to, electrical connectors for bonding, through-vias, solder regions, or the like, as discussed in accordance with some example embodiments. FIGS. 9 and 10 illustrate example honeycomb patterns. It is appreciated that FIGS. 9 and 10 illustrate small portions of the honeycomb patterns, and the illustrated patterns may be repeated to form larger patterns, which may be found referring to FIGS. 13, 14, 19, and 20 as examples. The honeycomb pattern includes a plurality of conductive features 70. Throughout the description, conductive features 70 are used to represent any of, and are not limited to, the electrical connectors 36, through-vias 30 and 35, electrical connectors 54, solder regions 64, and the like, which have been discussed in preceding paragraphs. Neighboring conductive features 70 form equilateral triangles. Alternatively stated, the honeycomb pattern includes conductive features 70 forming an equilateral hexagonal pattern, with an additional conductive feature 70 located at the center of the equilateral hexagonal pattern. It is appreciated that although conductive features 70 are illustrated as having top-view shapes of circles, the top-view shapes of conductive features 70 may also be any other applicable shape including, and not limited to, squares, ovals, hexagons, octagons, or the like.

FIG. 9 illustrates a vertical honeycomb pattern, wherein the center conductive feature 70 and two conductive features are aligned to a straight line in the Y-direction. In accordance with some embodiments, conductive features 70 are in package component 72, which may represent, and is not limited to, any of the above-discussed package components 58', 20', and 34 (FIGS. 6-8). Package component 72 may have a rectangular top-view shape, with some edges parallel to X-direction, and other edges parallel to Y-direction.

FIG. 10 illustrates a horizontal honeycomb pattern, wherein the center conductive feature 70 and two conductive features are aligned to a straight line in the X-direction. It is appreciated that the vertical honeycomb pattern and horizontal honeycomb pattern are relative concepts, depending upon the orientation that package component 72 is viewed. Alternatively stated, a vertical honeycomb pattern may become a horizontal honeycomb pattern when the respective package component 72 is rotated by 90 degrees.

Figure 12:
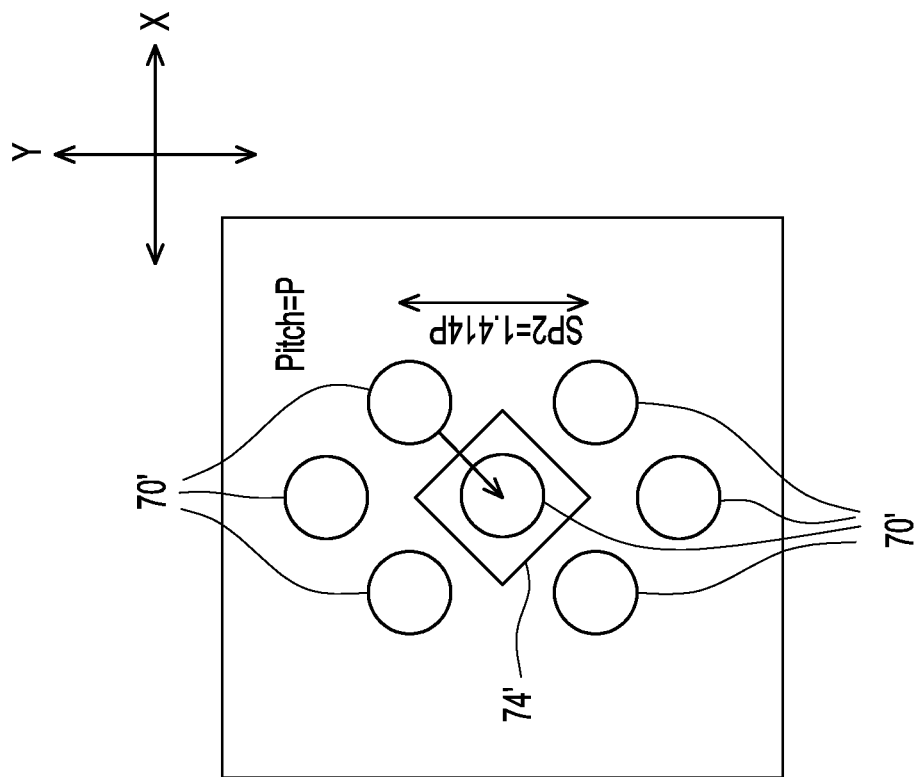
FIGS. 11 and 12 illustrate square patterns for arranging conductive features.
Figure 11:
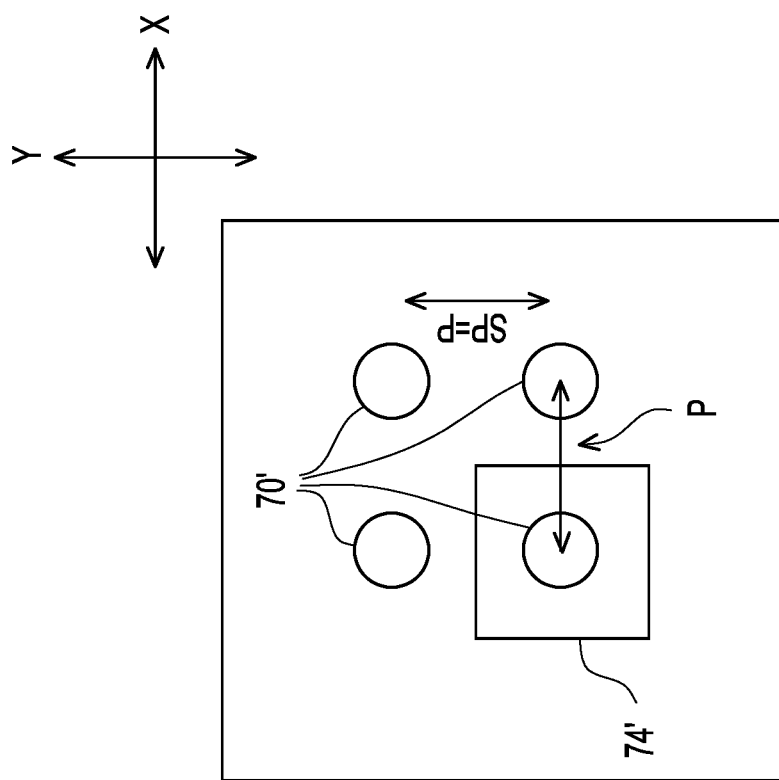

As shown in FIGS. 9 and 10, assuming the pitch between neighboring conductive features 70 is P, to allocating the conductive features 70 in a honeycomb pattern and having pitch P, a chip area 74 is needed for each of conductive features 70. Chip area 74 is referred to as an equivalent chip area hereinafter. The area of equivalent chip area 74 is equal to $(\sqrt{3}/2)*P^2$. This area is smaller than the equivalent chip area required by conductive features allocated as square patterns. For example, FIGS. 11 and 12 illustrate conventional square patterns for laying out conductive features 70'. FIG. 11 illustrates a horizontal square pattern, and FIG. 12 illustrates a vertical square pattern. The horizontal pattern may be rotated by 45 degrees to obtain the vertical square pattern, and vice versa. When the pitches of neighboring conductive features 70' in the square pattern is equal to P, the equivalent chip area 74' of conductive features 74 is equal to $P^2$, which is greater than the equivalent chip area of $(\sqrt{3}/2)*P^2$ in a honeycomb pattern. Alternatively stated, to allocate a conductive feature in a honeycomb pattern having a pitch P, an average chip area of $(\sqrt{3}/2)*P^2$ is needed, while to allocate a conductive feature in a square pattern having a pitch P, an average chip area of $P^2$ is needed. This means that the density of conductive features in a honeycomb patterns is $(1/(\sqrt{3}/2))$ percent, or 115.4%, of the density of the conductive features in a square pattern. The density (the number of conductive features per unit area) of the conductive features in the honeycomb pattern is thus greater than the density of the conductive features in the conventional square patterns by 15.4 percent.

Honeycomb pattern also provides flexibility in the allocation of conductive features 70. For example, FIG. 9 illustrates the vertical honeycomb pattern has shoreline pitch SP1, which is equal to pitch P. This is smaller than the shoreline pitch SP2 in the vertical square pattern as shown in FIG. 12. The shoreline pitch SP2 is equal to 1.414P, which is 41.4% higher than the shoreline pitch SP1. Accordingly, in certain layouts in which shoreline density (the number of wires connecting conductive features 70) is desired to be high, honeycomb pattern provides such flexibility.

Figure 15:
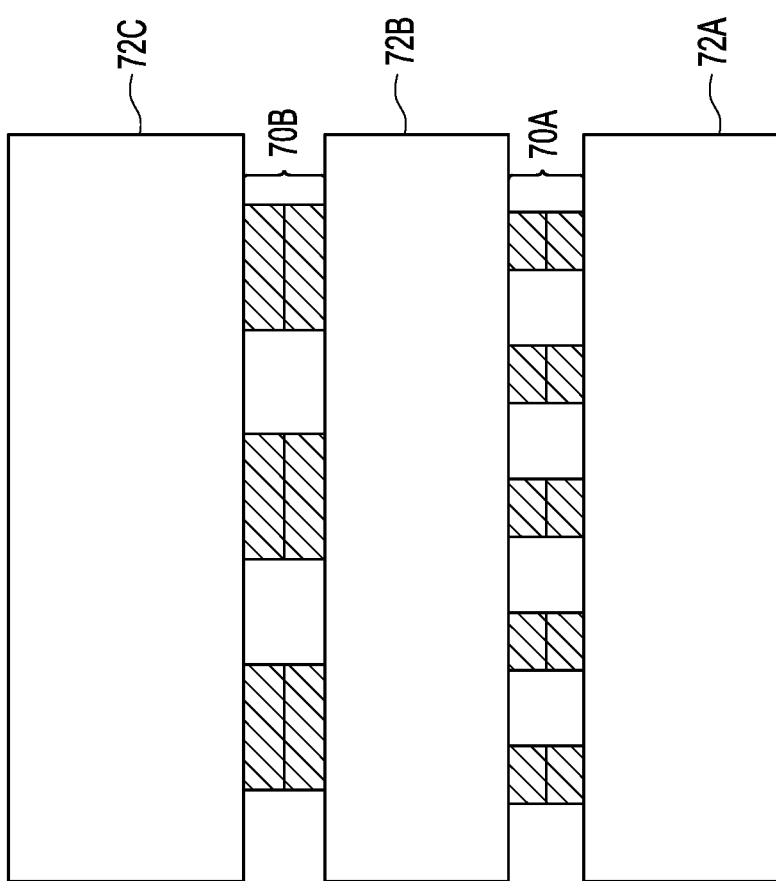
FIG. 15 illustrates the cross-sectional view of bonded electrical connectors of two package components in accordance with some embodiments.

As illustrated in FIGS. 6, 7, and 8, the conductive features 70 may be located at different levels. For example, solder regions 64, through-vias 30, solder regions 54, electrical connectors 36, and through-vias 35 are at different levels. Different levels of conductive features 70 may have different orientations (either horizontal honeycomb pattern or vertical honeycomb pattern), different densities, different sizes, or the like, from each other. Upper conductive features may overlap the corresponding lower conductive features, or may be vertically offset from the lower conductive features. For example, FIG. 15 illustrates a cross-sectional view showing three levels of package components 72A, 72B, and 72C, which may be package components 34, 20', 58, or the like. Lower conductive features are denoted as 70A, and upper conductive features are denoted as 70B. Conductive features 70A and 70B may have different pitches, different sizes, and may be vertically offset from each other.

FIG. 13 illustrates an example top view of conductive features 70A and 70B corresponding to FIG. 15, with both of conductive features 70A and 70B being allocated as having honeycomb patterns. In accordance with some embodiments, conductive features 70A have pitch P1, while the pitch P2 of conductive features 70B may be equal to, greater than, or smaller than, pitch P1. Both of conductive features 70A and 70B are allocated as vertical honeycomb patterns. The X-direction and Y-direction are illustrated to indicate the edge directions of the corresponding package components 72A, 72B, and 72C (FIG. 15). It is appreciated that the conductive features 70A and 70B in FIG. 13 are vertical honeycomb patterns, while they may also be horizontal honeycomb patterns, which may be realized from FIG. 13 by rotating the vertical honeycomb patterns by 90 degrees.

FIG. 14 illustrates an example top view of conductive features 70A and 70B, with both being allocated as honeycomb patterns. In accordance with some embodiments, conductive features 70A may also have an equal pitch as, or a greater pitch than, conductive features 70B. Conductive features 70A are allocated as having a vertical honeycomb pattern, while conductive features 70B are allocated as a horizontal honeycomb pattern. The X-direction and Y-direction are again illustrated to represent the edge directions of the corresponding package components 72A, 72B, and 72C (FIG. 15).

Figure 16:
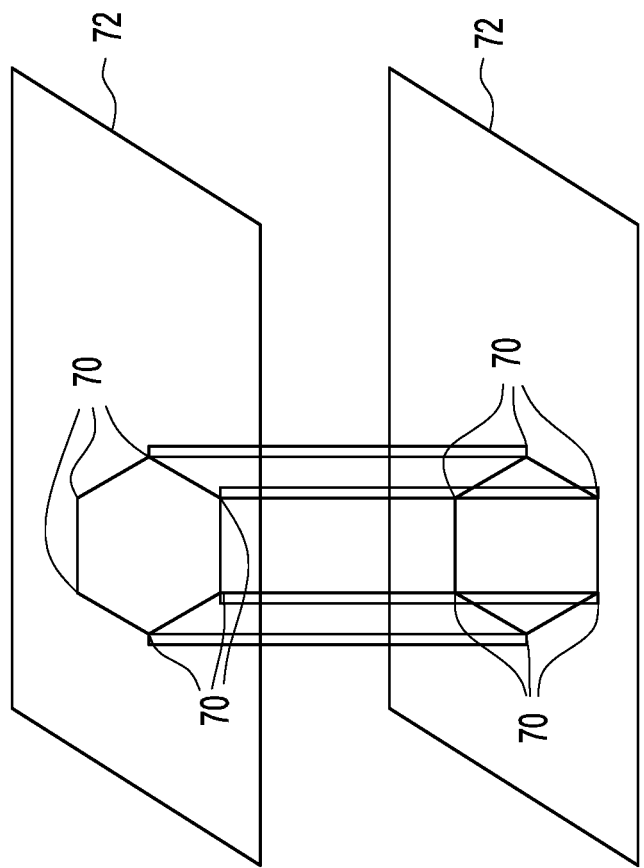
FIG. 16 illustrates a perspective view of two honeycomb patterns for allocating electrical connectors that are bonded to each other in accordance with some embodiments.

FIG. 16 illustrates how the electrical connectors 70 in an upper package component 72 may be aligned to the electrical connectors 70 in a lower package component 72, with the electrical connectors 70 in both of the package components having honeycomb patterns. The electrical connectors 70 in the upper package component 72 are bonded to the electrical connectors 70 in the lower package component 72, for example, similar to what has been discussed referring to electrical connectors 36A, 36B, and 36C in FIG. 1.

Figure 17B:
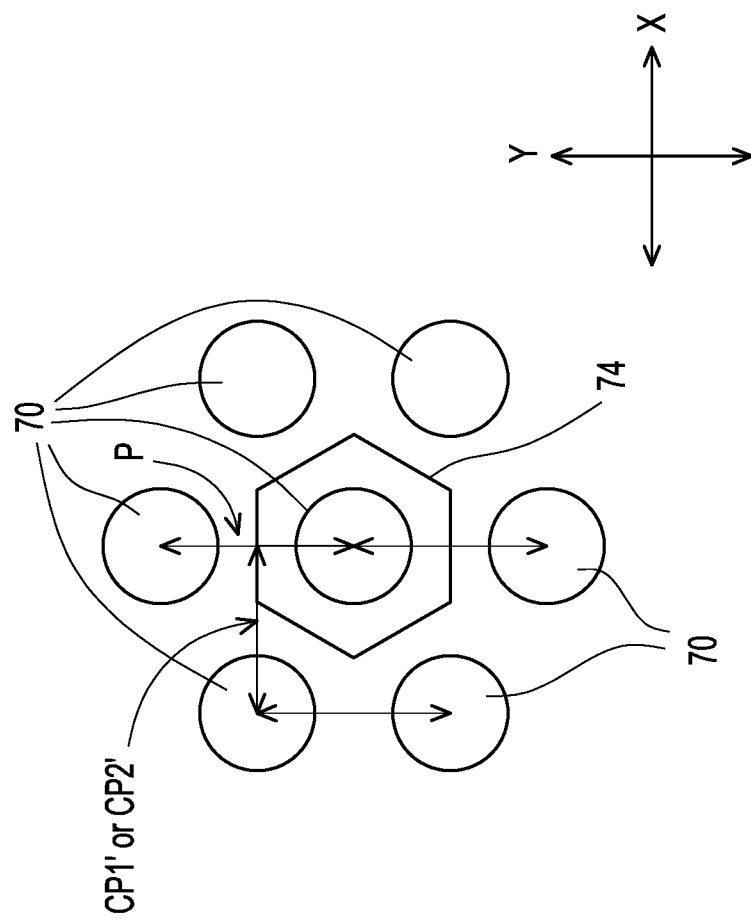
FIGS. 17A and 17B illustrate the design of a honeycomb pattern having column pitches with rational numbers in accordance with some embodiments.
Figure 17A:
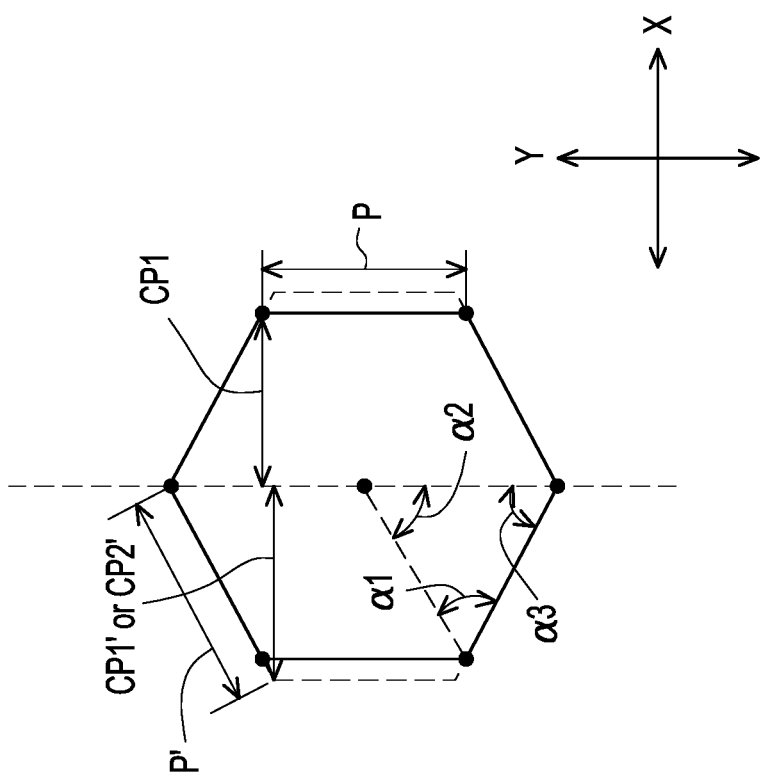

An ideal honeycomb structure may require the column pitch CP1 (FIG. 17A) of the hexagonal shapes to have irrational number/values when the corresponding pitch P has a rational numbers. The irrational numbers are unrealistic to achieve in the actual design and manufacturing process. Accordingly, the design and manufacturing process may be modified to enlarge the hexagonal shape in the X-direction to make the column pitches to have rational numbers. For example, FIG. 17A illustrates an example honeycomb pattern, and FIG. 17B illustrate the respective conductive features 70 having the honeycomb pattern. The shape having solid lines in FIG. 17A represents an ideal hexagonal shape, which has column Pitch CP1. Table 1 illustrates the pitch P of conductive features 70 and the corresponding column pitch CP1. Table 1 illustrates that when pitches P are rational numbers such as 100, 36, etc. the column pitches CP1 are irrational numbers such as 86.60254038 and 31.17691454, respectively (with more digits not shown). Accordingly, in the actual design, the column pitches may be modified to either CP1' or CP2', which are rational numbers. This is equivalent to stretch the ideal honeycomb patterns in X-direction, until the column pitch is modified to become a rational number. For example, the number 86.6025403 may be modified as either 87 (CP1') or 86.7 (CP2'), such that the geometry centers of conductive features 70 may be snapped to a grid of rational numbers. In accordance with some embodiments, the modified column pitch CP1' or CP2' are substantially equal to the original column pitch CP1, for example, with a difference smaller than about 5 percent, 2 percent, or 1 percent. Also, after the stretching, the pitches that are not in the Y-direction are modified as pitch P', which is difference from the original pitch P. In accordance with some embodiments, the pitch difference may be smaller than about 5 percent, 2 percent, or 1 percent. The angles α1, α2, and α3 may thus be close to, but may not be equal to, 60 degrees. For example, angles α1, α2, and α3 may be in the range between about 55 degrees and about 65 degrees. The modified pattern may also be referred to as a substantial honeycomb pattern.

TABLE 1

| Pitch | CP1 | CP1' | CP2' |
|---|---|---|---|
| 36 | 31.17691454 | 32 | 31.2 |
| 38 | 32.90896534 | 33 | 33 |
| 40 | 34.64101615 | 35 | 34.7 |
| 100 | 86.60254038 | 87 | 86.7 |
| 105 | 90.9326674 | 91 | 91 |
| 140 | 121.2435565 | 122 | 121.3 |

In order to achieve the modification of the column pitch, the design and the modification may be performed by modifying design tools, which do not have such functions currently. Also, there is no existing manufactured package having their conductive features arranged as honeycomb patterns because there is no Electronic Design Automation (EDA) tool available for laying out conductive features as honeycomb patterns, and for modifying the pitches to rational numbers.

Figure 18:
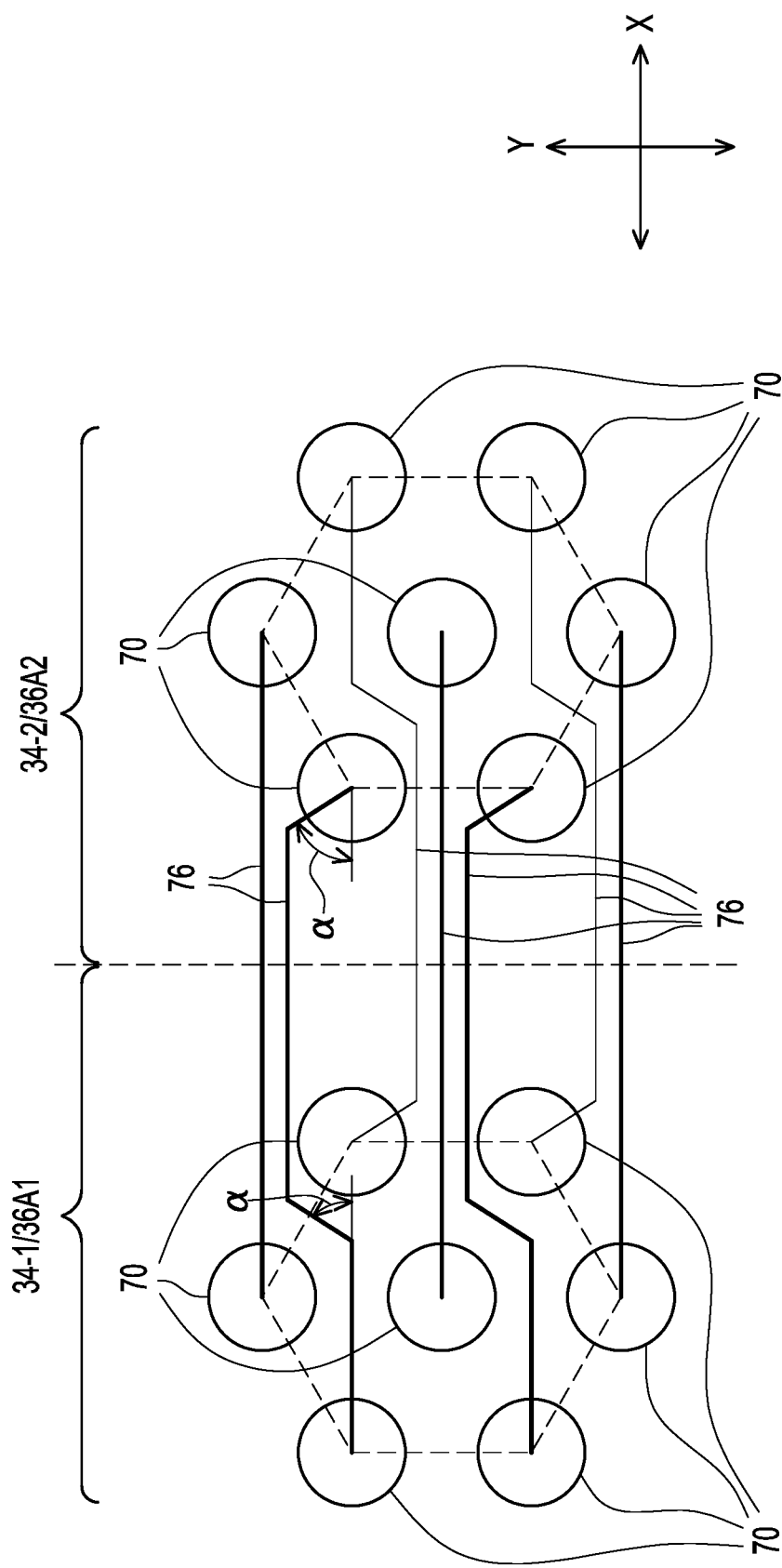
FIGS. 18-20 illustrate the conductive features arranged in honeycomb patterns and corresponding conductive lines in accordance with some embodiments.

FIG. 18 illustrates the layout of conductive lines and the corresponding electrical connectors for interconnecting two groups of conductive features 70. For example, as shown in FIG. 7, package components 34G and 34F (corresponding to package components 34-1 and 34-2 in FIG. 7) are interconnected through electrical connectors 36A1 and 36A2 (which are represented using conductive features 70 in FIG. 18) and conductive lines 76. As shown in FIG. 18, conductive features 70 (which may include electrical connectors 36A1 in package component 34-1 and electrical connectors 36A2 in 34-2, as shown in FIG. 7) are arranged in a honeycomb layout. Horizontal conductive lines 76 are used to interconnect the conductive features 36A1 and 36A2, which are underlying package components 34-1 and 34-2, respectively. In accordance with some embodiments, Horizontal conductive lines 76 are in a same level (such as the same layer in interposer 20' in FIG. 7), or may extend into a plurality of levels in package component 20'.

In FIG. 18, each of the conductive lines 76 include transition routes, which are the parts of conductive lines 76 not in the X-direction. In accordance with some embodiments, the transition routes may have slant angle α (relative to the X-direction) in the range between about 50 degrees and about 70 degrees. For example, slant angle α may be equal to 45 degrees for the convenience of the design of the routes. In accordance with alternative embodiments, to maximize the line width of conductive lines 76, the slant angle α may be designed to be 60 degrees, so the transition routes may be perpendicular to the straight lines that may be drawn to interconnect the centers of the conductive features 70. The design and the layout of the conductive lines 76 may be incorporated into the functions of software.

Figure 19:
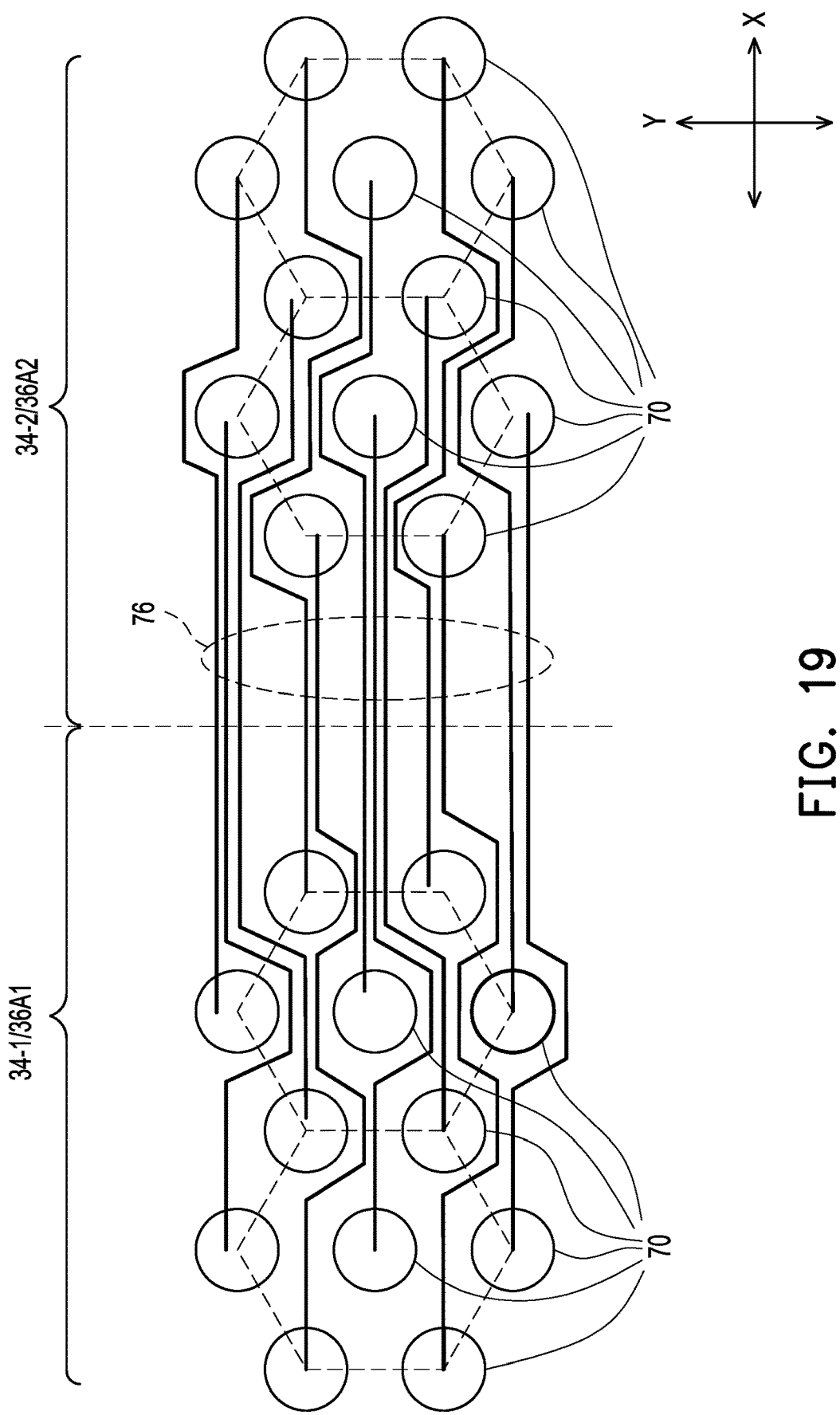

FIG. 19 illustrates the layout of conductive lines and electrical connectors for interconnecting two groups of conductive features 70. The example electrical connectors may include 36A1 and 36A2 in FIG. 7, which are underlying package components 34F and 34G (corresponding to package components 34-1 and 34-2 in FIG. 19), respectively. Each group of conductive features 70 includes two hexagonal patterns joined together. Horizontal conductive lines 76 may be in a same level (such as the same layer in interposer 20' in FIG. 7), or may extend into a plurality of levels.

Figure 20:
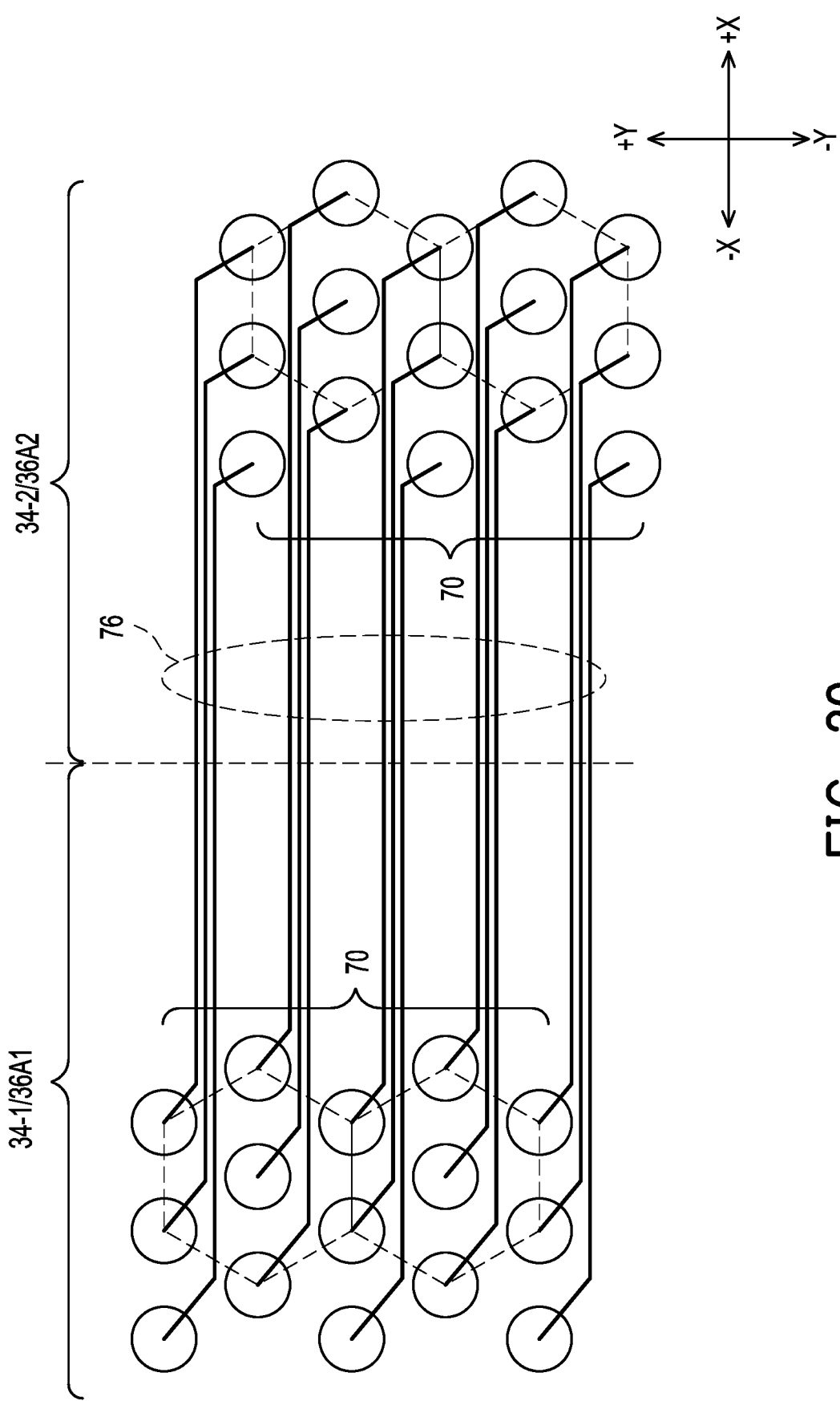

In accordance with some embodiments, the design of the conductive feature 70 and the conductive lines 76 as shown in FIGS. 18 and 19 may be used in circuits in which the delay caused by conductive lines 76 are not critical, so that the plurality of conductive lines 76 may have different lengths, and the delay caused by different conductive lines 76 are different from each other. In accordance with alternative embodiments, when the timing is critical, the design as shown in FIG. 20 may be adopted, wherein FIG. 20 illustrates a top view of FIG. 7 in an example. In accordance with some embodiments, the layout of the conductive features 70 in package component 34-1 may be rotated by 180 degrees to generate the layout of the conductive features in package component 34-2. Each of the conductive features 70 (such as electrical connectors 36A1) in package component 34-1 is connected to a corresponding conductive feature 70 (such as electrical connectors 36A2) in package component 34-2. All of the conductive paths thus may have a same length. In accordance with some embodiments, the conductive features 70 in package component 34-2 may be shifted in the —Y-direction by one row, so that the transition routes in conductive lines 76 may be minimized.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By designing and manufacturing conductive features such as bumps, bond pads, metal pillars, through-vias etc. with honeycomb layouts, the density of the conductive features may be increased. When the conductive features are used to transmit signals, the bandwidth of the signals may be increased due to the increase in the number of conduct features, allowing the parallel transfer of signals through more signal lines. There is no additional manufacturing cost for forming the conductive features in accordance with the embodiments of the present disclosure.

In accordance with some embodiments of the present disclosure, a method comprises forming a first package component; forming a first plurality of electrical connectors at a first surface of the first package component, wherein the first plurality of electrical connectors are laid out as having a honeycomb pattern; and bonding a second package component to the first package component, wherein a second plurality of electrical connectors at a second surface of the second package component are bonded to the first plurality of electrical connectors. In an embodiment, neighboring electrical connectors in the first plurality of electrical connectors form a substantially equilateral hexagonal pattern, with an additional electrical connector at a center of the substantially equilateral hexagonal pattern. In an embodiment, the forming the first package component comprises forming a plurality of conductive paths; and forming the first plurality of electrical connectors and a third plurality of electrical connectors at the first surface of the second package component, wherein the third plurality of electrical connectors form an additional honeycomb pattern, and wherein each of the plurality of conductive paths electrically connects one of the first plurality of electrical connectors to a corresponding one of the third plurality of electrical connectors. In an embodiment, the second plurality of electrical connectors are bonded to the first plurality of electrical connectors through solder bonding. In an embodiment, the method further comprises designing the honeycomb pattern, which designing comprises laying out the first plurality of electrical connectors as an equilateral hexagonal pattern; and stretching the equilateral hexagonal pattern in one of a column direction of the equilateral hexagonal pattern so that a column pitch of the first plurality of electrical connectors is converted from an irrational number to a rational number. In an embodiment, the first package component further comprises a plurality of through-vias arranged as an additional honeycomb pattern, and the method further comprises: polishing a semiconductor substrate of the first package component to reveal the plurality of through-vias, wherein the first plurality of electrical connectors are electrically connected to the plurality of through-vias. In an embodiment, the method further comprises bonding the second package component to a package substrate, wherein the package substrate further comprises a plurality of solder regions arranged as having an additional honeycomb pattern.

In accordance with some embodiments of the present disclosure, a package includes a package component, which comprises a first plurality of electrical connectors in the package component, wherein the first plurality of electrical connectors are arranged as having a first honeycomb pattern. In an embodiment, the package further comprises a device die, which comprises a second plurality of electrical connectors at a surface of the device die, wherein the second plurality of electrical connectors are arranged as having a second honeycomb pattern, and wherein each of the first plurality of electrical connectors is bonded to one of the second plurality of electrical connectors. In an embodiment, the first plurality of electrical connectors are at a surface of the package component, and wherein the package component further comprises a plurality of conductive paths; and a third plurality of electrical connectors at the surface of the package component, wherein the third plurality of electrical connectors form an additional honeycomb pattern, and wherein each of the plurality of conductive paths electrically connects one of the first plurality of electrical connectors to a corresponding one of the third plurality of electrical connectors. In an embodiment, the plurality of conductive paths have equal lengths. In an embodiment, a first layout of the third plurality of electrical connectors is rotated by 180 degrees relative to a second layout of the first plurality of electrical connectors. In an embodiment, each of the first plurality of electrical connectors and the third plurality of electrical connectors comprise a plurality of rows of electrical connectors, and the third plurality of electrical connectors are shifted relative to the first plurality of electrical connectors by one row. In an embodiment, neighboring electrical connectors in the first plurality of electrical connectors form an equilateral hexagonal pattern, with an additional electrical connector at a center of the equilateral hexagonal pattern. In an embodiment, the first plurality of electrical connectors are at a surface of the package component, and wherein the package component further comprises a semiconductor substrate; and a plurality of through-vias penetrating through the semiconductor substrate, wherein the plurality of through-vias are arranged as an additional honeycomb pattern. In an embodiment, the package further comprises a package substrate bonded to the package component, wherein the package substrate further comprises a plurality of solder regions arranged as having a honeycomb pattern. In an embodiment, the first plurality of electrical connectors comprises first two electrical connectors having a pitch equal to a first rational number, and a column pitch of the first honeycomb pattern is also equal to second rational number.

In accordance with some embodiments of the present disclosure, a package comprises a first package component; a first plurality of electrical connectors at a first surface of the first package component, wherein the first plurality of electrical connectors are laid out as having a honeycomb pattern; a second package component; and a second plurality of electrical connectors at a second surface of the second package component, wherein the first plurality of electrical connectors and the second plurality of electrical connectors are laid out as having honeycomb patterns, and wherein the first plurality of electrical connectors are bonded to corresponding ones of the second plurality of electrical connectors. In an embodiment, the package further comprises a third plurality of electrical connectors at a third surface of the second package component, wherein the second surface and the second surface are opposite surfaces of the second package component, and the second plurality of electrical connectors are directly over the third plurality of electrical connectors, and wherein the second plurality of electrical connectors and the third plurality of electrical connectors have different pitches. In an embodiment, the honeycomb patterns are stretched in one of a row direction and a column direction of the honeycomb patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a package component comprising:
a first plurality of electrical connectors at a surface of the package component, wherein the first plurality of electrical connectors are arranged as having a first honeycomb pattern;
a plurality of conductive paths; and
a second plurality of electrical connectors at the surface of the package component, wherein the second plurality of electrical connectors form a second honeycomb pattern, and wherein each of the plurality of conductive paths electrically connects one of the first plurality of electrical connectors to a corresponding one of the second plurality of electrical connectors.

2. The package of claim 1 further comprising:
a first device die bonding to the first plurality of electrical connectors; and
a second device die bonding to the second plurality of electrical connectors.

3. The package of claim 1, wherein neighboring electrical connectors in the first plurality of electrical connectors form a pattern that is at least substantially equilateral hexagonal, with a center connector in the first plurality of electrical connectors being at a center of the pattern.

4. The package of claim 3, wherein the pattern is equilateral hexagonal.

5. The package of claim 3, wherein the pattern is a stretched hexagonal pattern that is stretched in one of a column direction and a row direction of the first plurality of electric connectors.

6. The package of claim 1 further comprising solder regions joining the first plurality of electrical connectors.

7. The package of claim 1, wherein in a top view of the package component, the first plurality of electric connectors are arranged as a first plurality of rows, and the second plurality of electric connectors are arranged as a second plurality of rows, and wherein the second plurality of rows are shifted from the first plurality of rows by one row.

8. The package of claim 1, wherein in a top view of the package component, the first plurality of electric connectors are arranged as a first plurality of rows, and the second plurality of electric connectors are arranged as a second plurality of rows, and each row of the first plurality of rows and a corresponding row in the second plurality of rows are aligned to a same straight line.

9. The package of claim 1, wherein the plurality of conductive paths have a same length.

10. The package of claim 1, wherein the plurality of conductive paths have a same top-view shape.

11. A package comprising:
a first package component comprising:
a first plurality of electrical connectors at a top surface of the first package component; and
a second plurality of electrical connectors at a bottom surface of the first package component, wherein the first plurality of electrical connectors and the second plurality of electrical connectors are laid out as having honeycomb patterns, and wherein the first plurality of electrical connectors and the second plurality of electrical connectors have different pitches.

12. The package of claim 11, wherein in a top view of the package, the first plurality of electrical connectors and the second plurality of electrical connectors are interlaced.

13. The package of claim 11, wherein top-view widths of the first plurality of electrical connectors are different from top-view widths of the second plurality of electrical connectors.

14. The package of claim 11 further comprising:
a third plurality of electrical connectors at the top surface of the first package component;
a fourth plurality of electrical connectors at the top surface of the first package component, wherein both of the third plurality of electrical connectors and the fourth plurality of electrical connectors form honeycomb patterns; and
a plurality of conductive lines, each electrically connecting one of the third plurality of electrical connectors to a corresponding one of the fourth plurality of electrical connectors.

15. The package of claim 14, wherein in a top view of the first package component, a conductive line in the plurality of conductive lines is aligned to a straight line, and wherein a first end and a second end of the conductive line are connected to a first connector in the first plurality of electrical connectors and a second connector in the second plurality of electrical connectors, respectively, and wherein in the top view, the first connector and the second connector are on opposite sides of the straight line.

16. The package of claim 14, wherein the plurality of conductive lines have equal lengths.

17. The package of claim 14 further comprising a first device die and a second device die bonding to the first plurality of electrical connectors and the second plurality of electrical connectors, respectively.

18. A package comprising:
a package component comprising:
a first plurality of electrical connectors at a surface of the package component, wherein the first plurality of electrical connectors are located on first nodes forming first hexagonal patterns, and wherein the first hexagonal patterns have a first row pitch and a first column pitch;
a second plurality of electrical connectors at the surface of the package component, wherein the second plurality of electrical connectors are located on second nodes forming second hexagonal patterns, and wherein the second hexagonal patterns have a second row pitch and a second column pitch, and wherein the first row pitch is equal to the second row pitch; and a plurality of conductive lines, each connecting one of the first plurality of electrical connectors to one of the second plurality of electrical connectors.

19. The package of claim 18, wherein the first column pitch is further equal to the second column pitch.

20. The package of claim 18, wherein the plurality of conductive lines have a same length.

* * * * *